(12) United States Patent
Przytarski et al.

(10) Patent No.: US 10,509,082 B2
(45) Date of Patent: Dec. 17, 2019

(54) MAGNETORESISTIVE SENSOR SYSTEMS WITH STRAY FIELD CANCELLATION UTILIZING AUXILIARY SENSOR SIGNALS

(71) Applicant: NXP B.V., Eindhoven (NL)

(72) Inventors: Jan Przytarski, Hamburg (DE); Jörg Kock, Horst (DE); Stephan Marauska, Kaltenkirchen (DE); Edwin Schapendonk, Oss (NL)

(73) Assignee: NXP B.V., Eindhoven (NL)

( * ) Notice: Subject to any disclaimer, the term of this patent is extended or adjusted under 35 U.S.C. 154(b) by 119 days.

(21) Appl. No.: 15/891,512

(22) Filed: Feb. 8, 2018

(65) Prior Publication Data

US 2019/0242956 A1     Aug. 8, 2019

(51) Int. Cl.
| | |
|---|---|
| G01B 7/15 | (2006.01) |
| G01B 7/30 | (2006.01) |
| H01L 43/08 | (2006.01) |
| G01R 33/09 | (2006.01) |
| B82Y 10/00 | (2011.01) |
| B82Y 25/00 | (2011.01) |
| G01D 5/14 | (2006.01) |

(Continued)

(52) U.S. Cl.
CPC ............ *G01R 33/093* (2013.01); *B82Y 10/00* (2013.01); *B82Y 25/00* (2013.01); *G01D 5/12* (2013.01); *G01D 5/145* (2013.01); *G01D 5/147* (2013.01); *G01D 5/16* (2013.01); *G01R 33/09* (2013.01); *G01R 33/096* (2013.01); *G01R 33/091* (2013.01); *G01R 33/098* (2013.01)

(58) Field of Classification Search
CPC .......... G01D 5/145; G01D 5/16; G01D 5/147; G01D 5/12; G01R 33/09; G01R 33/093; G01R 33/091; G01R 33/098
See application file for complete search history.

(56) References Cited

U.S. PATENT DOCUMENTS

| | | |
|---|---|---|
| 4,752,733 A | 6/1988 | Petr et al. |
| 7,746,065 B2 | 6/2010 | Pastre et al. |
| 8,818,749 B2 | 8/2014 | Friedrich et al. |

(Continued)

FOREIGN PATENT DOCUMENTS

| | | |
|---|---|---|
| EP | 1 728 048 B1 | 8/2011 |
| EP | 2472272 A2 | 7/2012 |

(Continued)

*Primary Examiner* — Raul J Rios Russo
(74) *Attorney, Agent, or Firm* — Charlene R. Jacobsen

(57) ABSTRACT

A system includes first and second magnetic sense elements for producing first and second output signals, respectively, in response to an external magnetic field along a sensing axis parallel to a plane of the first sense element, a magnetization direction of the second element being rotated in the plane relative to a magnetization direction of the first element. The second output signal differs from the first output signal in dependency to a magnetic interference field along a non-sensing axis of the first magnetic field. A processing circuit, receives the first and second output signals, identifies from a relationship between the first and second output signals an influence of the magnetic interference field on the first output signal, and applies a correction factor to the first output signal to produce a resultant output signal in which the influence of the magnetic interference field is substantially removed.

20 Claims, 12 Drawing Sheets

(51) Int. Cl.
*G01D 5/16* (2006.01)
*G01D 5/12* (2006.01)

(56) References Cited

U.S. PATENT DOCUMENTS

| | | |
|---|---|---|
| 2002/0171418 A1 | 11/2002 | Hinz et al. |
| 2005/0280957 A1 | 12/2005 | Gill |
| 2008/0180089 A1 | 7/2008 | Stolfus et al. |
| 2015/0042319 A1 | 2/2015 | Furuichi et al. |
| 2016/0320462 A1 | 11/2016 | Mather et al. |
| 2017/0212175 A1* | 7/2017 | Holm ................ G01R 33/0005 |
| 2017/0212176 A1* | 7/2017 | Holm ................ G01R 33/0005 |
| 2017/0307697 A1* | 10/2017 | Holm ................ G01R 33/0206 |

FOREIGN PATENT DOCUMENTS

| | | |
|---|---|---|
| EP | 2472272 A3 | 7/2012 |
| JP | 2006-250580 A | 9/2006 |

* cited by examiner

MAGNETORESISTIVE SENSOR SYSTEMS WITH STRAY FIELD CANCELLATION UTILIZING AUXILIARY SENSOR SIGNALS

TECHNICAL FIELD OF THE INVENTION

The present invention relates generally to magnetoresistive sensors. More specifically, the present invention relates to magnetoresistive sensors and systems incorporating the magnetoresistive sensors for measuring magnetic fields while substantially cancelling an influence of stray magnetic fields along one or more axes.

BACKGROUND OF THE INVENTION

Magnetic field sensor systems are utilized in a variety of commercial, industrial, and automotive applications to measure magnetic fields for purposes of speed and direction sensing, rotation angle sensing, proximity sensing, and the like. A magnetoresistive sensor can be sensitive to interference magnetic fields, also known as stray magnetic fields. A stray magnetic field along a non-sensing axis of a magnetic field sensor may change the sensitivity and linearity range of the sensor, thus negatively affecting the magnetic field detection quality. A stray magnetic field along a sensing axis of a magnetic field sensor may additionally introduce an error component (e.g., a voltage shift) in the output signal of the sensor.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
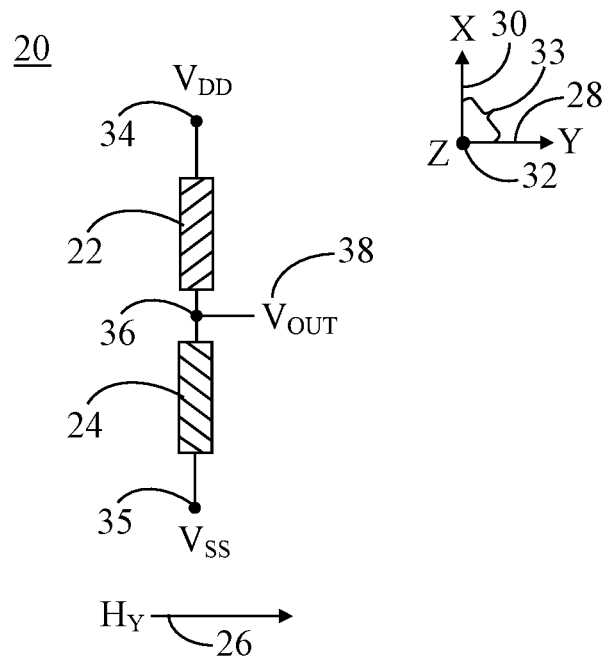
FIG. 1 shows, in a simplified and representative form, a half bridge structure of magnetic sense elements.

In overview, the present disclosure concerns magnetic field sensors, and systems incorporating the magnetic field sensors for measuring magnetic fields while substantially cancelling an influence of stray magnetic fields along one or more axes. More particularly, a system includes one or more primary magnetic field sense elements and one or more auxiliary magnetic field sense elements located in proximity to the primary magnetic field sense elements. The auxiliary magnetic field sense elements are rotated in a plane relative to the primary magnetic field sense elements. More particularly, the magnetization direction of the auxiliary magnetic field sense elements is rotated in the plane relative to the magnetization direction of the primary magnetic field sense elements. Setting auxiliary sensor signals output from the auxiliary magnetic field sense elements in relation with primary sensor signals output from the primary magnetic field sense elements enables the extraction of the magnetic field strength of stray magnetic fields along a non-sensing axis. Knowledge of this field strength can be used to compensate for, or otherwise cancel, an adverse signal contribution resulting from the stray magnetic field along a non-sensing axis. The primary and auxiliary magnetic sense elements may be incorporated in a gradient unit approach which additionally enables cancellation of an adverse signal contribution resulting from a homogeneous (i.e., uniform) stray magnetic field along the sensing axis. Thus, a uniaxial (i.e., single-axis) magnetic sense element may effectively be achieved. One or more magnetic field sense elements with one or more auxiliary sense elements can be implemented in various system configurations for purposes of speed and direction sensing, rotation angle sensing, proximity sensing, and the like.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Referring to FIG. 1, FIG. 1 shows, in a simplified and representative form, a half bridge structure 20 that includes a first magnetic sense element 22 and a second magnetic sensor element 24. Each of first and second magnetic sense elements 22, 24 is configured to detect (e.g., sense) an external magnetic field, represented by an arrow 26 oriented in a left-to-right direction on the page. In this example, external magnetic field 26, is oriented substantially parallel to a Y-axis 28 within a three-dimensional coordinate system that also includes an X-axis 30 oriented in an up-down direction on the page. Y-axis 28 and X-axis 30 define a plane 33 of magnetic sense elements 22, 24, where plane 33 corresponds to the layer magnetization of magnetic sense elements 22, 24. A Z-axis 32 is oriented into and out of the page, and is thus perpendicular to plane 33. External magnetic field 26, oriented within plane 33 substantially parallel to Y-axis 28, may be referred to as an $H_Y$ external magnetic field 26 herein.

First and second magnetic sense elements 22, 24 may be anisotropic magnetoresistive (AMR) sense elements capable of changing the value of their electrical resistance in response to an externally-applied magnetic field. For example, first magnetic sense element 22 may include permalloy ($N_{180}Fe_{20}$) stripes that are oriented positive forty-five degrees relative to a direction of external magnetic field 26 and second magnetic sense element 24 may include permalloy stripes that are oriented negative forty-five degrees relative to the direction of external magnetic field 26. The orientation of the stripes may enable maximum sensitivity and quasi linear response of first and second magnetic sense elements 22, 24 for small magnetic fields of up to a few kiloamperes per meter (kA/m). However, other angular orientations are also possible. Although AMR sense elements are mentioned herein. Alternative embodiments may include other magnetoresistive sensor technologies, such as giant magnetoresistive (GMR) sense elements, tunnel magnetoresistive (TMR) sense elements, and so forth.

Connection terminals for half-bridge magnetic sensor structure 20 include a $V_{DD}$ terminal 34, a $V_{SS}$ terminal 35, and a $V_{OUT}$ terminal 36. $V_{DD}$ terminal 34 may be connected to a positive output terminal of a regulated internal voltage supply (not shown) and $V_{SS}$ terminal 35 may be connected to a negative output terminal of the regulated internal voltage supply or to a system ground. $V_{OUT}$ terminal 36 is an output terminal for half-bridge magnetic sensor structure 20 at which a first output signal 38 produced by half-bridge magnetic sensor structure 20 of first and second magnetic sense elements 22, 24 in response to external magnetic field 26 is available for further processing.

Figure 2:
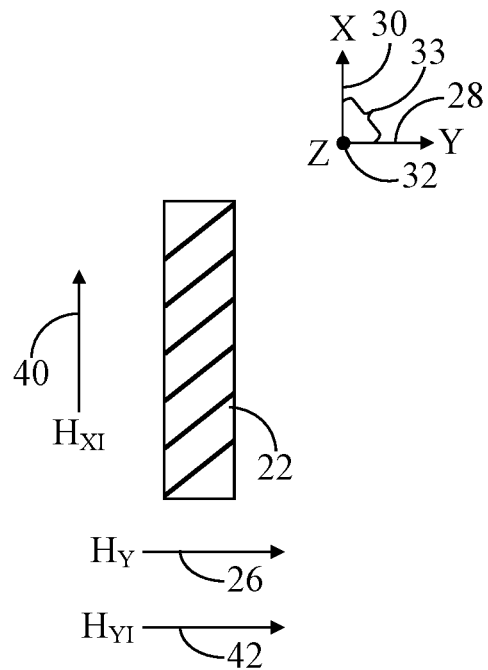
FIG. 2 shows a simplified top view of a single magnetic sense element.

FIG. 2 shows a simplified top view of a single magnetic sense element. In this example, FIG. 2 shows first magnetic sense element 22. The following discussion applies to second magnetic sense element 24 (FIG. 1) as well. As mentioned above, first magnetic sense element 22 is configured to detect (e.g., sense) external magnetic field 26 along a sensing axis, which in this example is Y-axis 28. However, first magnetic sense element 22 may also be sensitive to stray magnetic fields (magnetic interference fields) that are parallel to the layer magnetization of first magnetic sense element 22. Thus, first magnetic sense element 22 may be subjected to interference from stray magnetic fields along the sensing axis (i.e., Y-axis 28) and the non-sensing axis (i.e., X-axis 30) parallel to plane 33 of the sensor.

In general, first magnetic sense element 22 is a magnetoresistive sensor having a very thin film or layer (e.g., a few nanometer up to a ten nanometer thickness in some applications) along Z-axis 32. This very thin layer leads to a strong layer internal anisotropy field. This field generally prevents rotation of the magnetization into the Z-direction. Thus, magnetoresistive sensors (e.g., first and second magnetic sense elements 22, 24) are relatively insensitive to stray magnetic fields along Z-axis 32. Therefore, stray magnetic fields along Z-axis 32 are not considered herein.

In this example, a stray magnetic interference field oriented along the non-sensing X-axis 30 is represented by an arrow 40 directed upward on the page and is labeled $H_{XI}$. Hence, this stray magnetic interference field may be referred to as non-sensing axis stray magnetic field 40. Similarly, a stray magnetic interference field oriented along the sensing Y-axis 28 is represented by an arrow 42 directed rightward on the page and is labeled $H_{YI}$. Hence, this stray magnetic interference field may be referred to as sensing axis stray magnetic field 42. Non-sensing and sensing axis stray magnetic fields 40, 42 can corrupt first output signal 38 (FIG. 1) or reduce the signal-to-noise ratio (SNR) to unacceptable levels. This can have significant impact on safety-critical designs in, for example, the automotive industry.

Figure 3:
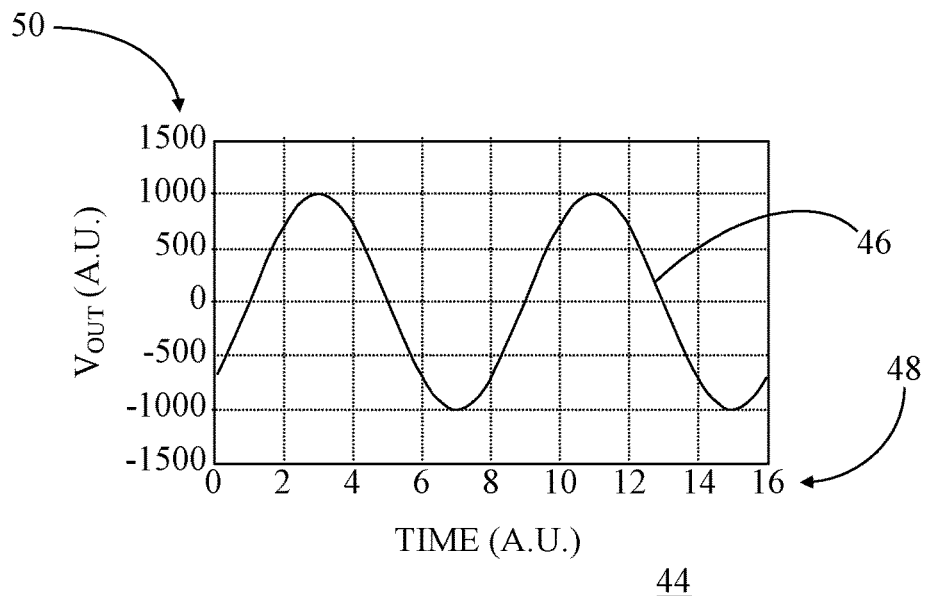
FIG. 3 shows a graph of an example voltage response of a magnetic sense element with respect to a varying external magnetic field.

FIG. 3 shows a graph 44 of an example sensor response, in the form of a voltage response 46, of a magnetic sense element (e.g., $V_{OUT}$ 38 of half-bridge magnetic sensor structure of FIG. 1) with respect to a varying external magnetic field. More particularly, graph 44 depicts time 48 (TIME) on the horizontal axis and output voltage 50 ($V_{OUT}$) on the vertical axis. In response to a varying external magnetic field (e.g., external magnetic field 26 of FIG. 1), voltage response 46 of the magnetic sense element will also vary. In this illustration, voltage response 46 is sinusoidally varying. The depiction of voltage response 46 as sinusoidally varying in FIG. 3 is an ideal or representative signal that can be distorted by non-sensing and sensing axis stray magnetic fields 40, 42.

Figure 4:
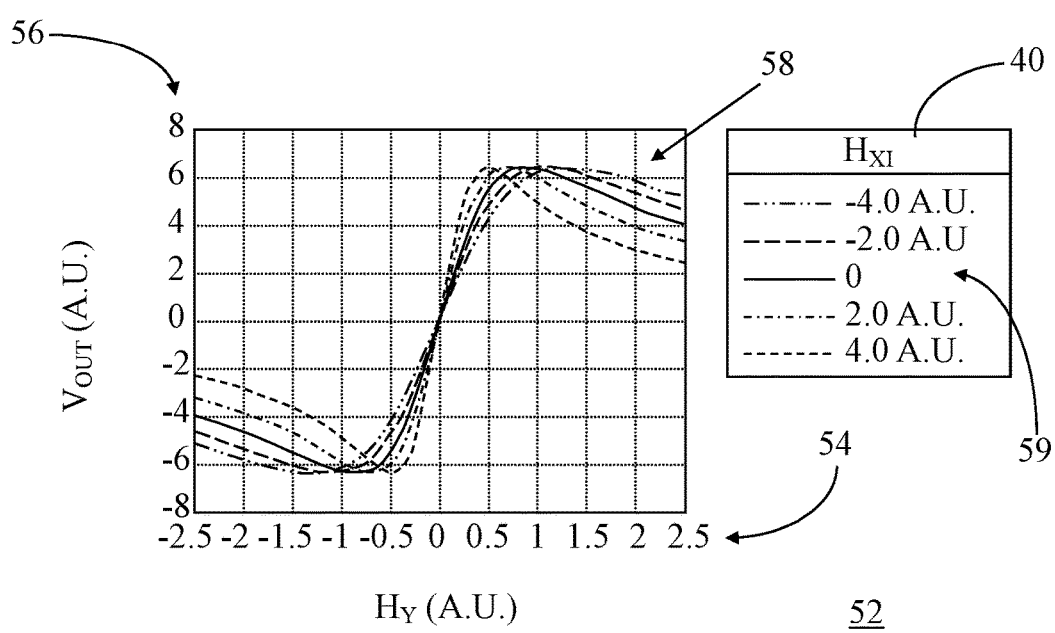
FIG. 4 shows a graph of examples of a voltage response of a magnetic sense element in response to an external magnetic field along a sensing axis and a dependence of the voltage response on the field strength of non-sensing axis stray magnetic fields.

FIG. 4 shows a graph 52 of examples of the voltage response of a magnetic sense element (e.g., $V_{OUT}$ 38 of half-bridge magnetic sensor structure of FIG. 1) in response to external magnetic field 26 (FIG. 2) along a sensing axis and the dependence of the voltage response on the field strength of non-sensing axis stray magnetic fields 40 (FIG. 2). More particularly, graph 52 shows a field strength 54 ($H_Y$) of an external magnetic field along the horizontal axis and an output voltage 56 ($V_{OUT}$) along the vertical axis. Graph 52 provides an array of characteristic voltage response curves 58 (e.g., voltage responses) exemplifying a dependence (e.g., variance) of the sensed external magnetic field 26 (FIG. 1) in the presence of non-sensing axis stray magnetic field 40 (FIG. 2). That is, characteristic voltage response curves 58 change in response to a field strength 59 of non-sensing axis stray magnetic field 40. In graph 52, field strength 54, output voltage 56, and field strengths 59 of non-sensing axis stray magnetic field 40 are shown in arbitrary units (A.U.) for simplicity.

A solid curve within the array of characteristic curves 58 represents a condition in which field strength 59 of non-sensing axis stray magnetic field 40 is equal to zero (e.g., there is no non-sensing axis stray magnetic field 40). The remaining curves within the array of characteristic curves 58 represent the variance (e.g., distortion) of voltage response of the magnetic sense element when a non-sensing axis stray magnetic field 40 of a certain field strength 59 is applied. Consequently, the presence of non-sensing axis stray magnetic field 40, or a change in field strength 59 of non-sensing axis stray magnetic field 40, results in a change of the output voltage from the magnetic sense element, which may be mistaken as a change in field strength 54 of external magnetic field 26. The change in the characteristic voltage response curve caused by field strength 59 of non-sensing axis stray magnetic field 40 can be described as a function $f(H_{X1})$, and its effect on field strength 54, $H_Y$, of an external magnetic field 26 along Y-axis 28 (FIG. 2) for a linearized system can be described as follows:

$$V_{OUT}=f(H_{X1})*H_Y \qquad (1)$$

Thus, the distortion represented by the characteristic curves 58 in the presence of non-sensing axis stray magnetic fields 40 can be readily characterized and visualized in comparison with the absence of a non-sensing axis stray magnetic field 40.

Magnetoresistive sensor technologies may achieve better jitter accuracy than, for example, Hall sensors. However, magnetoresistive sensor technologies are typically sensitive in two spatial axes and are thus more prone to magnetic interference (i.e., stray) field influences, even in combination with a gradiometer approach (discussed below). In accordance with embodiments described below, knowledge of the non-sensing axis stray magnetic fields 40 and knowledge of the dependency of the voltage response variations of external magnetic field 26 in dependency to non-sensing axis stray magnetic field 40 (e.g., due to characterization as indicated in FIG. 4) enables correction or cancellation of the effect of non-sensing axis stray magnetic fields 40. In addition, a gradient unit approach (discussed below) can additionally enable correction or cancellation of the effect of sensing axis stray magnetic fields 42 (FIG. 2). Thus, a system that includes magnetoresistive sense elements gains the benefit of improved jitter accuracy over Hall sensors, while the stray magnetic field cancellation techniques described herein enables the reduction of distortion effects typically observed in magnetoresistive sensor technologies.

Figure 5:
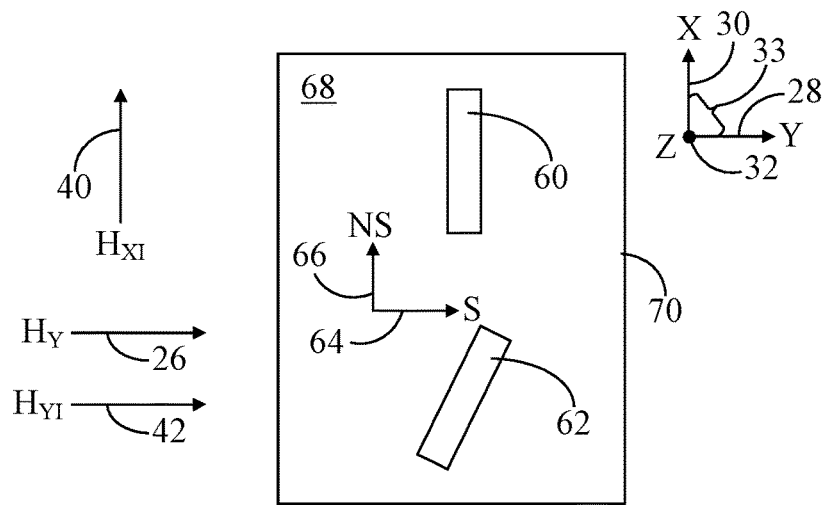
FIG. 5 shows a top view of magnetic sense elements in accordance with an embodiment.

Referring now to FIG. 5, FIG. 5 shows a top view of magnetic sense elements in accordance with an embodiment. In particular, FIG. 5 shows a first magnetic sense element 60 and a second magnetic sense element 62 rotated in plane 33 relative to first magnetic sense element 60. In an embodiment, first and second magnetic sense elements 60, 62 are formed on a planar surface 68 of a substrate 70. Plane 33 is parallel to planar surface 68, and plane 33 corresponds to, i.e., is aligned with, a layer magnetization of first and second magnetic sense elements 60, 62. First and second magnetic sense elements 60, 62 are represented as single structural elements for simplicity. In an implementation, first and second magnetic sense elements 60, 62 may be connected in a half bridge configuration. Further, first sense element 60 may be formed having a first magnetization direction of the sense layer (e.g., permalloy stripes) that is oriented +/−45° and second sense element 62 may be formed having a second magnetization direction of the sense layer (e.g., permalloy stripes) that is oriented +/−25° so that the magnetization directions differ between the first and second magnetic sense elements 60, 62 of the half bridge configuration by approximately 20°. Hence, phraseology used herein of second magnetic sense element 62 being rotated relative to first magnetic sense element 60 refers to the difference in the magnetization directions of the sense layer of first and second magnetic sense elements 60, 62.

First and second magnetic sense elements 60, 62 may be magnetoresistive sense elements such as AMR, GMR, TMR sense elements, and so forth capable of detecting a magnetic field. Further, each of first and second magnetic sense elements 60, 62 may be a single stripe or dot, as well as include an array of the former, and can be connected as in a single bridge, half bridge, or full bridge configuration. As will be discussed in significantly greater detail below, first magnetic sense element 60 may alternatively be referred to herein as a primary magnetic sense element 60 and second magnetic sense element 62 may alternatively be referred to herein as an auxiliary magnetic sense element 62. Only one primary magnetic sense element 60 and one auxiliary magnetic sense element 62 are shown for simplicity. Other configurations may include multiple primary and auxiliary magnetic sense elements arranged in half-bridge or full bridge configurations.

As depicted in FIG. 5, primary and auxiliary magnetic sense elements 60, 62 are suitably fabricated to have a sensing axis 64, labeled "S," and a non-sensing axis 66, labeled "NS." Each of primary and auxiliary magnetic sense elements 60, 62 is configured to sense external magnetic field 26 in plane 33 parallel to Y-axis 28. In some embodiments, auxiliary magnetic sense element 62 may be rotated in plane 33 by, for example, twenty degrees relative to primary magnetic sense element 60. In other words, the magnetization direction of the sense layer of auxiliary magnetic sense element 62 is rotated relative to primary magnetic sense element. The rotation of the magnetization direction of auxiliary magnetic sense element 62 relative to primary magnetic sense element 60 changes the sensitivity/slope and possible maximum/minimum values attainable by auxiliary magnetic sense element 62 relative to primary magnetic sense element 60. Although, an example rotation of twenty degrees is discussed herein, other magnitudes of rotation of the magnetization direction of auxiliary magnetic sense element 62 relative to primary magnetic sense element 60 may be implemented in alternative embodiments.

As discussed in detail above, magnetoresistive sense elements, such as primary and auxiliary magnetic sense elements 60, 62, are sensitive to interfering magnetic fields that are parallel to the layer magnetization of the magnetoresistive sense elements (e.g., non-sensing axis stray magnetic field 40 and sensing axis stray magnetic field 42). In accordance with an embodiment, a differing sensor response of the rotated auxiliary magnetic sense element 62 relative to the sensor response of primary magnetic sense element 60 in the presence of non-sensing axis stray magnetic field 40 can be exploited to compensate for, or otherwise cancel, an adverse signal contribution resulting from stray magnetic field 40 along non-sensing axis (e.g., X-axis 30).

Figure 6:
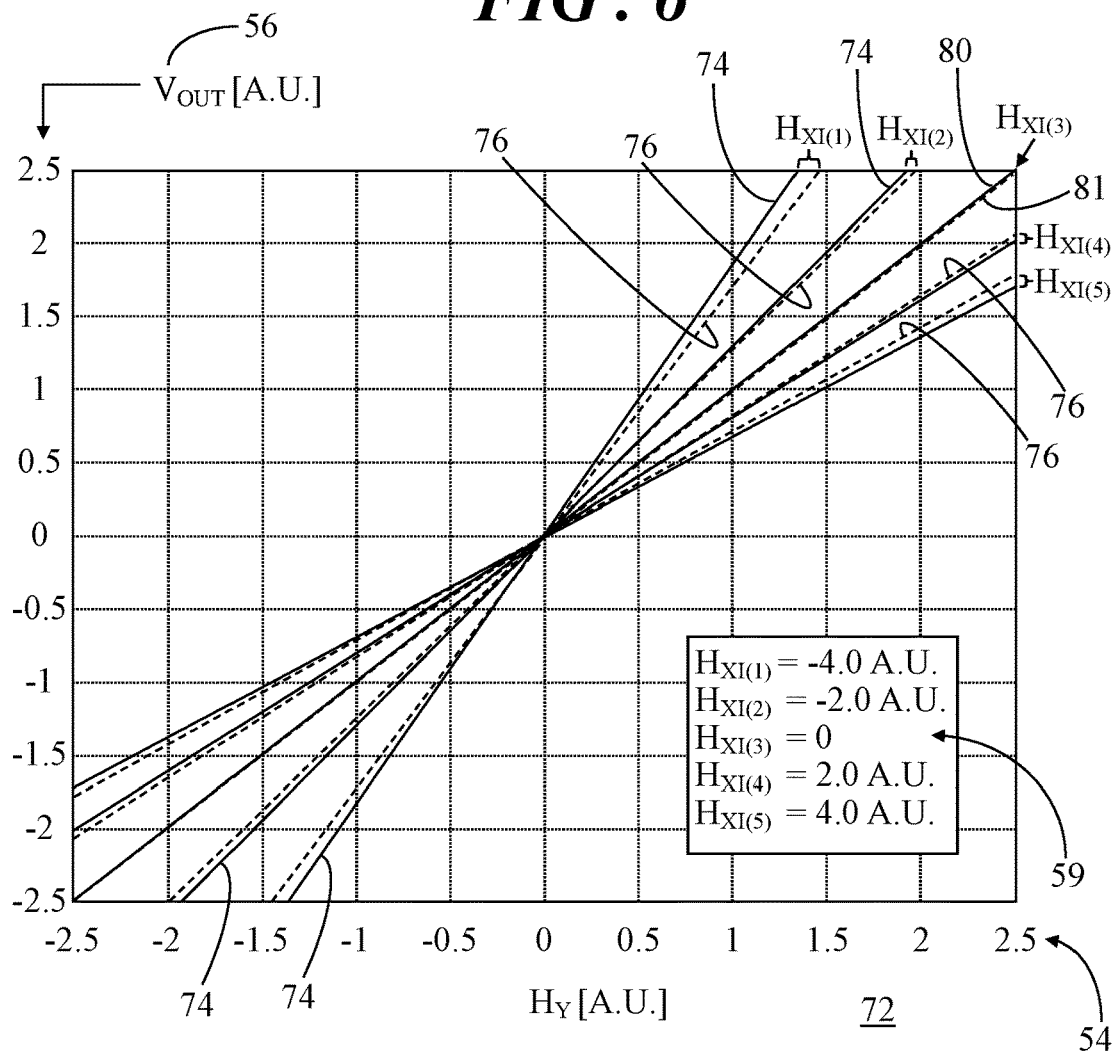
FIG. 6 shows a graph of linearize voltage responses of the magnetic sense elements of FIG. 5.

Referring concurrently to FIGS. 5 and 6, FIG. 6 shows a graph 72 of linearized voltage responses of the magnetic sense elements of FIG. 5. More particularly, graph 72 shows field strength 54 ($H_Y$) of an external magnetic field on the horizontal axis and output voltage 56 ($V_{OUT}$) on the vertical axis. Graph 72 provides an array of voltage responses 74, 76 demonstrating a dependence (i.e., variance) of the voltage response from the sensed external magnetic field 26 (FIG. 1) in the presence of non-sensing axis stray magnetic field 40 at various field strengths 59 ($H_{XI(n)}$), where n=1-5). In graph 72, field strength 54, output voltage 56, and field strengths 59 of non-sensing axis stray magnetic field 40 are again represented by arbitrary units (A.U.) for simplicity. Further, the behavior of the magnetic sense elements is shown for a linear sensitivity working range or by linearized magnetic sense elements (e.g., by trimming). Other non-linear response curves may alternatively be used.

In graph 72, a voltage response 80 (solid line) from primary magnetic sense element 60 represents a condition in which field strength 59 of non-sensing axis stray magnetic field 40 is equal to zero (i.e., there is no non-sensing axis stray magnetic field 40) and a voltage response 81 (dashed line) from auxiliary magnetic sense element 62. Thus, the slopes of voltage responses 80, 81 from primary and auxiliary magnetic sense elements 60, 62 may be different. Voltage responses 74 (solid lines) represent the variance (i.e., distortion) of the sensor signal from primary magnetic sense element 60 when non-sensing axis stray magnetic field 40 of a certain field strength 59 is applied. Similarly, voltage responses 76 (dashed lines) represent the variance (i.e., distortion) of the sensor signal from auxiliary magnetic sense element 62 when non-sensing axis stray magnetic field 40 of a certain field strength 59 is applied. It can be readily observed from graph 72 that voltage responses 76 differ from voltage responses 74 at the various field strengths 59 of non-sensing axis stray magnetic field 40. This can be readily observed as the difference between the slope of voltage response 76 relative to voltage response 74 at the same field strength 59. The difference in the slopes of voltage responses 74, 76 is more pronounced at the higher values of field strength 59 of non-sensing axis stray magnetic field 40. The linearized response represented in graph 72 yields the following:

$$V_{OUT} = m1(H_{XI}) \times H_Y \quad (2)$$

$$V_{AUX-OUT} = m2(H_{XI}) \times H_Y \quad (3)$$

In equation (2), $V_{OUT}$ represents voltage response 74 of primary magnetic sense element 60 at a particular field strength 59 of non-sensing axis stray magnetic field 40 and m1 is the slope of the voltage response 74. In equation (3), $V_{AUX-OUT}$ represents voltage response 76 of auxiliary magnetic sense element 62 at a particular field strength 59 of non-sensing axis stray magnetic field 40 and m2 is the slope of the voltage response 76. The slopes of voltage responses 74, 76 are modified, or affected, by non-sensing axis stray magnetic field, $H_{XI}$. Due to their proximity, field strength 54, $H_Y$, of the sensed external magnetic field 26 is the same in each of equations (2) and (3). A quotient value, Q, can therefore be determined from equations (2) and (3), as follows:

$$Q = \frac{V_{OUT}}{V_{AUX-OUT}} = \frac{m1(H_{XI}) \times H_Y}{m2(H_{XI}) \times H_Y} = \frac{m1}{m2} \quad (4)$$

Thus, in equation (4), the quotient value, Q, is a ratio of the output voltage ($V_{OUT}$) of primary magnetic sense element 60 to the output voltage ($V_{AUX-OUT}$) of auxiliary magnetic sense element 62. More specifically, the quotient value, Q, represents the differences of the slopes of response curve 74 of primary magnetic sense element 60 and response curve 76 of auxiliary magnetic sense element 62 at a particular field strength 59 of non-sensing axis stray magnetic field 40. In the absence of non-sensing axis stray magnetic field 40, exemplified by response curve 80, m1 is equal to m2. Therefore, the quotient value, Q, for response curve 80 is 1. However, in the presence of non-sensing axis stray magnetic field 40, m1 is not equal to m2.

Figure 7:
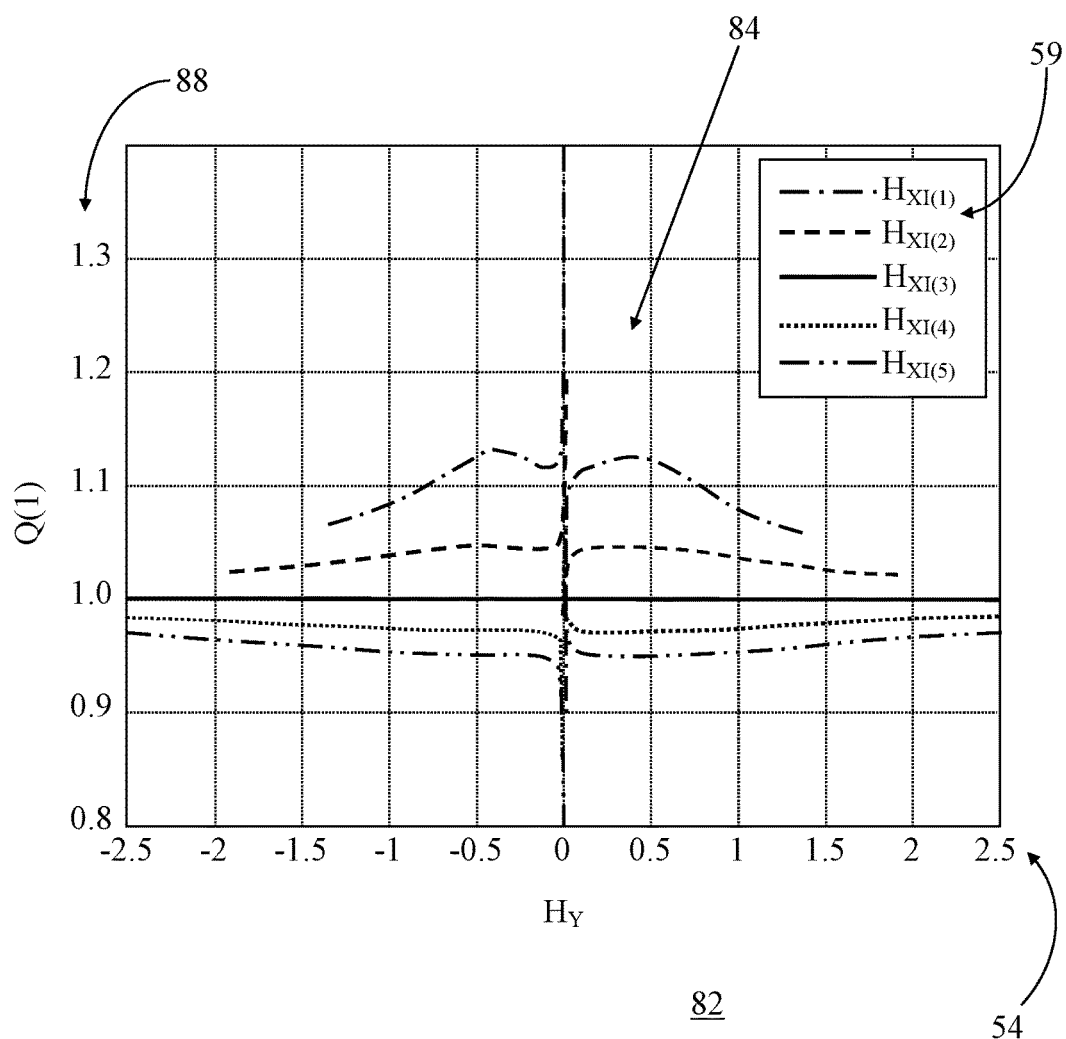
FIG. 7 shows a graph of plotted quotient value curves relative to a field strength of an external magnetic field along a sensing axis.

FIG. 7 shows a graph 82 of plotted quotient value curves 84. More particularly, graph 82 shows field strength 54 ($H_Y$) of an external magnetic field on the horizontal axis and quotient values 88 (Q) on the vertical axis. It can be observed that certain field strengths 59 ($H_{XI}$) of non-sensing axis stray magnetic field 40 result in a distinct quotient value curve 84 that is in dependence upon (i.e., varies in response to) field strength 54 of external magnetic field 26. Thus, field strength 59 of non-sensing axis stray magnetic field 40 may be determined from quotient values 88. By using the knowledge of the dependency of the linearized response curves 74, 76, 80 (FIG. 6), a correction of the characteristic curve is possible and the error due to non-sensing axis stray magnetic fields 40 may be eliminated (discussed below).

To summarize, from the linearized responses presented in graph 72 (FIG. 6), a quotient value, Q, can be computed in accordance with equations (2)-(4) as the differences of the slopes of related $V_{OUT}$ and $V_{AUX-OUT}$. Therefore, the quotient value, Q, is nearly constant for a given field strength 59 of non-sensing axis stray magnetic field 40. The quotient factor, Q, may be associated with a particular field strength of the non-sensing axis stray magnetic field 40 and stored in memory (discussed below) during a final test and calibration process. Additionally, a correction factor which is an inverse of the slope of m1 for the sensor output, $V_{OUT}$, of primary magnetic sense element 60 can be stored in the memory in association with the quotient factor, Q, and a particular field strength 59 of the non-sensing axis stray magnetic field 40.

As will be discussed in greater detail in connection with FIG. 8, in operation, a quotient value, Q, from received sensor signals $V_{OUT}$ and $V_{AUX-OUT}$ can be computed. The computed quotient values can be compared with the quotient values stored in memory to extract field strength 59 of non-sensing axis stray field 40. Additionally, the associated correction factor can be extracted from the memory and can be applied to the sensor output, $V_{OUT}$, of primary magnetic sense element 60 to compensate for the effect of the particular field strength 59 of the non-sensing axis stray field 40 in order to obtain the measured field strength of external magnetic field 26.

Figure 8:
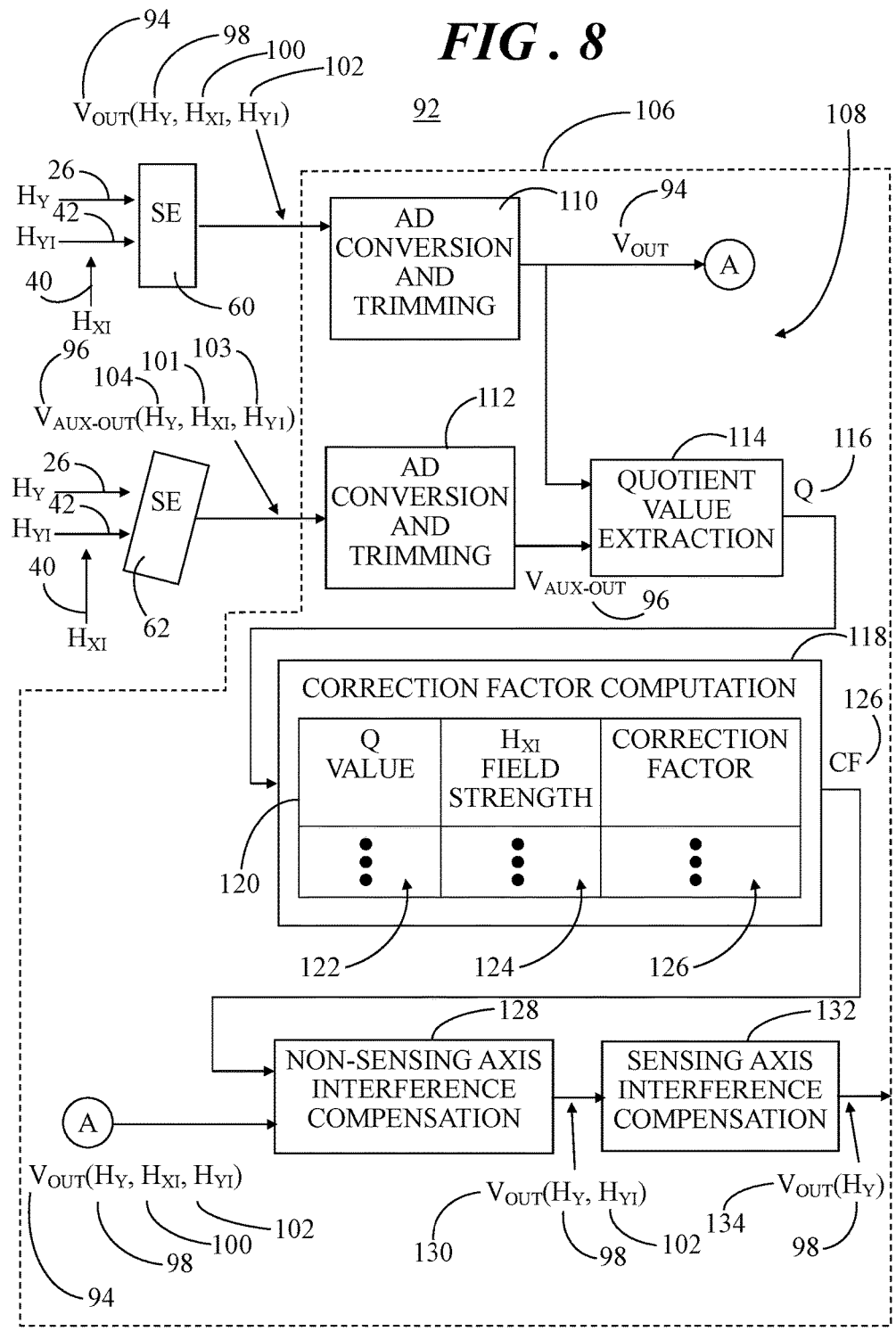
FIG. 8 shows a simplified block diagram of a system incorporating the magnetic sense elements of FIG. 5.

FIG. 8 shows a simplified block diagram of a system 92 incorporating primary magnetic sense element 60 and auxiliary magnetic sense element 62. The block diagram of FIG. 8 is provided to demonstrate the cancellation of the adverse signal contributions of non-sensing and sensing axis stray magnetic fields 40, 42 to an output signal representing the external magnetic field 26. Additional processing operations will not be described herein for brevity.

First magnetic sense element 60 (referred to herein as primary magnetic sense element 60) is configured to produce a first (i.e., primary) output signal 94, labeled $V_{OUT}$ ($H_Y$, $H_{XI}$, $H_{YI}$) and second magnetic sense element 62 (referred to herein as auxiliary magnetic sense element 62) is configured to produce a second (i.e., auxiliary) output signal 96, labeled $V_{AUX-OUT}$($H_Y$, $H_{XI}$, $H_{YI}$). Each of first and second output signals 94, 96 reflects all magnetic field sources (i.e., external magnetic field 26, non-sensing axis stray magnetic field 40, and sensing axis stray magnetic field 42). Accordingly, primary magnetic sense element 60 produces first output signal 94 (a voltage output in this instance) having a first magnetic field signal component 98 responsive to external magnetic field 26. In the presence of stray magnetic interference fields, first output signal 94 will additionally have a non-sensing axis stray field signal component 100 and a sensing axis stray field signal component 102. Similarly, auxiliary magnetic sense element 62 produces second output signal 96 (also a voltage output in this instance) having a second magnetic field signal component 104 responsive to external magnetic field 26. In the presence of stray magnetic interference fields, second output signal 96 will additionally have non-sensing axis stray field signal component 101 and sensing axis stray field signal component 103. Thus, the term "component" utilized herein refers to the parts or constituents (i.e., external magnetic field 26, non-sensing axis stray magnetic field 40, and sensing axis stray magnetic field 42) that make up first output signal 94. Further, non-sensing axis stray field signal component 100, 101 and sensing axis stray field signal component 102, 103 represent the adverse influence of non-sensing axis and sensing axis stray magnetic fields 40, 42, respectively, on first and second output signals 94, 96.

In the interest of clarity, external magnetic field 26, first magnetic field signal component 98, and second magnetic field signal component 104 share the same label, $H_Y$, in the illustrations. Non-sensing axis stray magnetic field 40 and non-sensing axis stray field signal component 100, 101 share the same label, $H_{XT}$. And, sensing axis stray magnetic field 42 and sensing axis stray field signal component 102, 103 share the same label, $H_{YT}$. In accordance with an embodiment, non-sensing axis stray field signal component 100, 101 will largely be canceled utilizing information provided in second output signal 96 produced by auxiliary magnetic sense element 62.

In some embodiments, primary magnetic sense element 60 and auxiliary magnetic sense element 62 may be fabricated on, or otherwise integrated with, an application specific integrated circuit (ASIC) 106, designated by a dashed line box encircling blocks in the block diagram of system 92. By way of example, primary magnetic sense element 60 and auxiliary magnetic sense element 62 may be fabricated in one or more top metal layers of ASIC 106. ASIC 106 may implement, among other features, a processing circuit 108 that is customized to function with primary and auxiliary magnetic sense elements 60, 62. As will be discussed below, processing circuit 108 can encompass a wide variety of processing, control, or other structures. Further, the term "circuitry" utilized in conjunction with the structures of processing circuit 108 can encompass analog, digital, and/or mixed-signal electronic circuits. Therefore, in the interest of brevity and minimization of any risk of obscuring the principles and concepts of the various embodiments, further discussion of such structures, if any, will be limited to the essentials with respect to the principles and concepts of the various embodiments.

First output signal 94 is provided to first analog-to-digital (AD) conversion and trimming circuitry 110 of processing circuit 108. At first AD conversion and trimming circuitry 110, first output signal 94 is converted from an analog to a digital signal. In FIG. 8, first output signal 94 retains the same reference numeral following AD conversion at first AD conversion and trimming circuitry 110 to emphasize its relationship to the signal output from primary magnetic sense element 60. Additionally, first output signal 94 may undergo further processing such as temperature compensation, offset compensation, and so forth based upon, for example, trimming data. Similarly, second output signal 96 is provided to second AD conversion and trimming circuitry 112 of processing circuit 108. At second AD conversion and trimming circuitry 112, second output signal 96 is converted from an analog to a digital signal, and second output signal 96 may undergo temperature compensation, offset compensation, and so forth based upon, for example, trimming data. Again in FIG. 8, second output signal 96 retains the same reference numeral following AD conversion at second AD conversion and trimming circuitry 112 to emphasize its relationship to the signal output from auxiliary magnetic sense element 62.

Following processing at first AD conversion and trimming circuitry 110, first output signal 94 may be provided to quotient value extraction circuitry 114. Likewise, second output signal 96 may be provided to quotient value extraction circuitry 114 following processing at second AD conversion and trimming circuitry 112. Quotient value extraction circuitry 114 extracts a quotient value 116, labeled Q, as a ratio of first output signal 94 relative to second output signal 96 as demonstrated in equations (2)-(4). Upon extraction of quotient value 116 at quotient value extraction circuitry 114, quotient value 116 is provided to correction factor computation circuitry 118. Correction factor computation circuitry 118 may have a memory element 120 associated with it containing calibration data. This calibration data can include a database of quotient values 122, a unique magnetic field strength parameter 124 of non-sensing axis stray magnetic field 40 ($H_{XT}$) associated with each quotient value 122, and a unique correction factor (CF) 126 dependent upon each quotient value 122, as discussed above in connection with FIGS. 6 and 7.

Correction factor 126 in turn is provided to non-sensing axis interference compensation circuitry 128. Additionally, first output signal 94 produced by primary magnetic sense element 60 containing magnetic field signal component 98, non-sensing axis stray field signal component 100, and sensing axis stray field signal component 102 is provided from first analog-to-digital (AD) conversion and trimming circuitry 110 to non-sensing axis interference compensation circuitry 128. Non-sensing axis interference compensation circuitry 128 applies correction factor 126 to first output signal 94 to produce a resultant output signal 130 in which non-sensing axis stray field signal component 100, $H_{XT}$, representing the influence of non-sensing axis stray magnetic field 40 is substantially removed. As shown, non-sensing axis interference compensation circuitry 128 outputs or otherwise provides resultant output signal 130 in which non-sensing axis stray field signal component 100 is canceled.

To summarize, methodology performed by system 92 entails producing a first output signal 94 at a first magnetic sense element 60 in response to external magnetic field 26. The first output signal 94 has a first magnetic field signal component 98 and a magnetic interference field signal component (non-sensing axis stray field signal component 100). The first magnetic field signal component 98 is in response to the external magnetic field directed along a sensing axis (y-axis 28) parallel to a plane 33 of the first magnetic sense element 60 and the magnetic interference field signal component 100 is in response to a magnetic interference field (non-sensing axis stray magnetic field 40) directed along a non-sensing axis (X-axis 30) of the first magnetic sense element 60. At a second magnetic sense element 62 that is rotated in the plane 33 relative to the first magnetic sense element 60, the methodology further entails producing a second output signal 96 having a second magnetic field signal component 104 in response to the external magnetic field 26 and having the magnetic interference field signal component (non-sensing axis stray field signal component 101). The methodology further entails, receiving at a processing circuit 108, the first and second output signals 94, 96, identifying from the second output signal 96 an influence 100 ($H_{XT}$) of the magnetic interference field 40 on the first magnetic field signal component 98, and applying a correction factor 126 to the first output signal 94 to produce a resultant output signal 130 in which the magnetic interference field signal component 100 is substantially removed.

Still further, the methodology entails computing, at the processing circuit 108, a quotient value 116 as a ratio of the first output signal 94 to the second output signal 96 and utilizing, at the processing circuit 108, the quotient value 116 to determine the correction factor 126, wherein the quotient value 116 is distinct for one of a plurality of magnetic interference fields 59 along the non-sensing axis (X-axis 30) and is dependent upon a magnetic field strength 54 of the external magnetic field 26.

In this example, resultant output signal 130 may thus include, or is otherwise a function of, magnetic field signal component 98, $H_Y$, and sensing axis stray field signal component 102, $H_{YT}$. In accordance with some embodiments, resultant output signal 130, as a first resultant output signal 130, may be provided to sensing axis interference compensation circuitry 132. Sensing axis interference compensation circuitry 132 compensates for or otherwise cancels sensing axis stray field signal component 102 from first resultant output signal 130 to yield a second resultant output signal 134. As shown, sensing axis interference compensation circuitry 132, provides second resultant output signal 134 in which sensing axis stray field signal component 102 is canceled. The cancellation of sensing axis stray field signal component 102 may be performed in accordance with a gradient unit configuration approach described below in connection with FIGS. 9-17. In FIG. 8, sensing axis interference compensation circuitry 132 is shown as having a single input for simplicity of illustration. However, in a gradient unit configuration, system 92 would be configured to include at least one additional input to sensing axis interference compensation circuitry 132, as shown and discussed in connection with FIG. 13. Second resultant output signal 134 may thereafter undergo further processing operations, such as, offset correction, protocol generation, pulse-shaping, and so forth that are not described herein for brevity.

Figure 9:
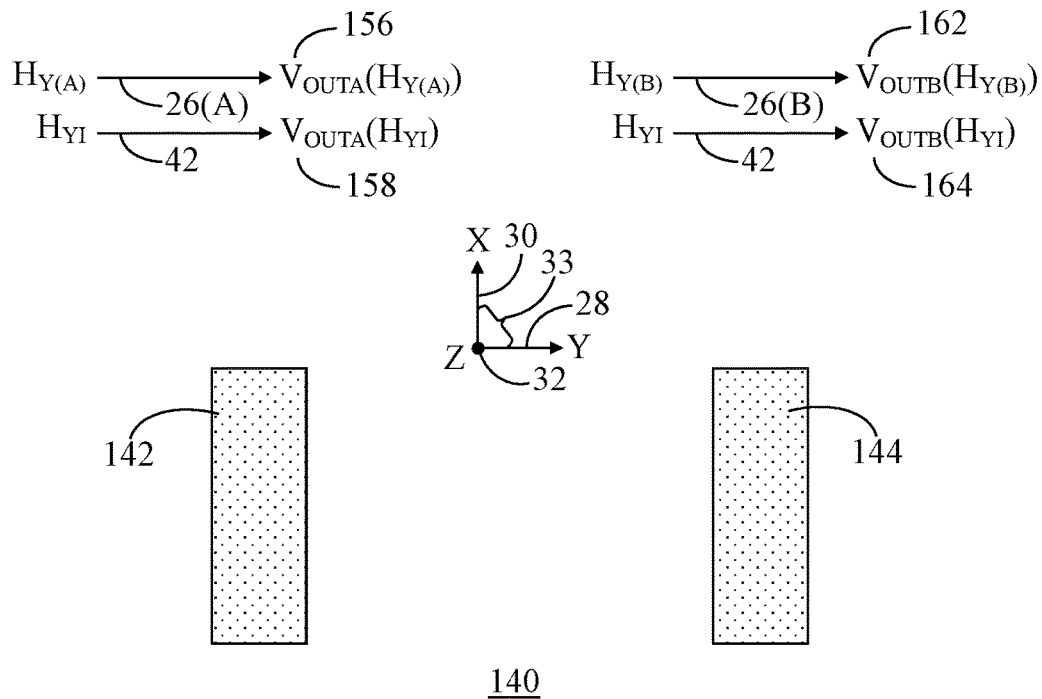
FIG. 9 shows a simplified top view of a pair of magnetic sense elements arranged as a gradient unit.
Figure 10:
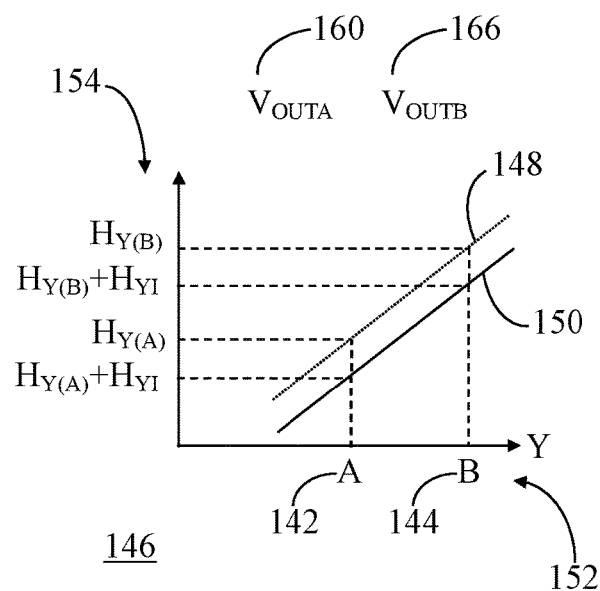
FIG. 10 shows a graph of a magnetic gradient field distribution in a direction parallel to the sensing axis for the gradient unit of FIG. 9 and the magnetic gradient field distribution modified in response to a spatial homogeneous interference magnetic field directed along the sensing axis.
Figure 18:
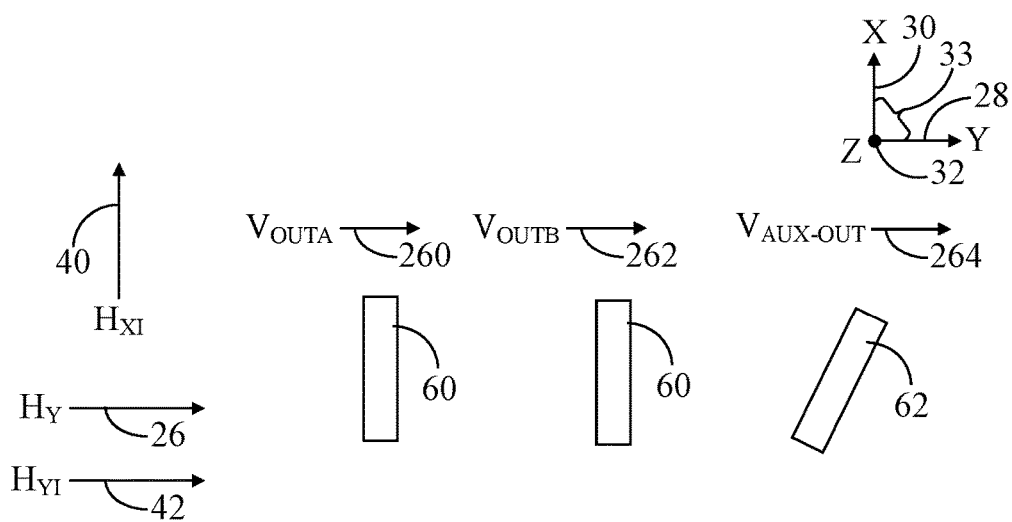
FIG. 18 shows a top view of magnetic sense elements in accordance with another embodiment.
Figure 19:
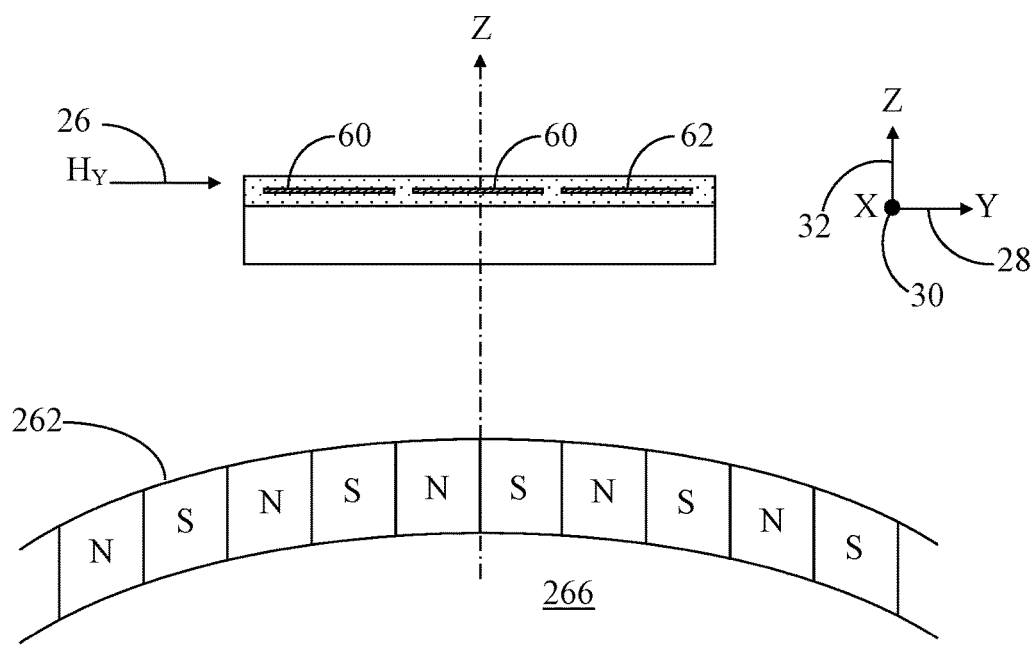
FIG. 19 shows a simplified partial side view of a system for rotational speed measurement incorporating the magnetic sense elements of FIG. 18.
Figure 20:
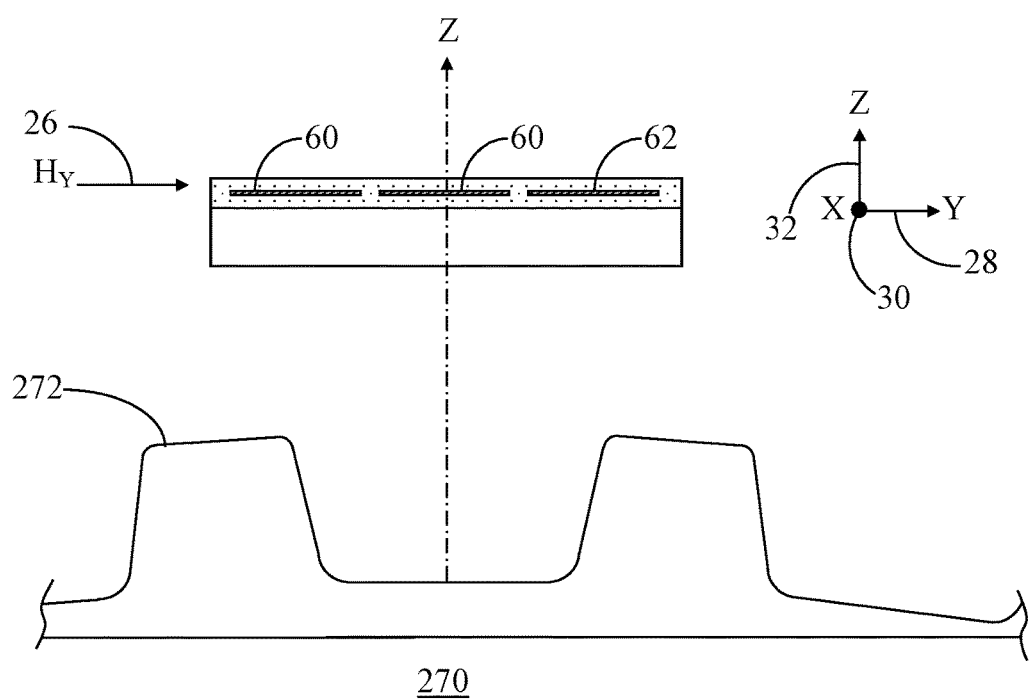
FIG. 20 shows a simplified partial side view of a system for rotational speed measurement incorporating the magnetic sense elements of FIG. 18.

Subsequent discussion in connection with FIGS. 9-17 applies to a gradient unit approach that may be employed to cancel or otherwise compensate for sensing axis stray magnetic field 42 at, for example, sensing axis interference compensation circuitry 132, within system 92. FIGS. 9-10 will first be discussed to provide a generalized approach for cancelling or otherwise compensating for sensing axis stray magnetic field 42. FIGS. 11-17 are subsequently provided to describe a configuration for determining an angle of rotation that additionally includes the structure discussed above for canceling non-sensing and sensing stray magnetic fields 40, 42. Additionally, FIGS. 18-20 are provided to describe a configuration for rotational speed measurement that additionally includes the structure discussed above for canceling at least non-sensing stray magnetic field 40.

With reference now to FIG. 9, FIG. 9 shows a simplified top view of a pair of magnetic sense elements arranged as a gradient unit 140. Gradient unit 140 includes a first magnetic sense element 142 and a second magnetic sense element 144. First and second magnetic sense elements 142, 144 are laterally spaced apart along the sensing axis direction (i.e., Y-axis 28). First and second magnetic sense elements 142, 144 are configured to sense external magnetic field 26 along the sensing axis, which is Y-axis 28 herein. Thus, for purposes of clarity, first magnetic sense element 142 senses external magnetic field 26(A), labeled $H_{Y(A)}$, and second magnetic sense element 144 senses external magnetic field 26(B), labeled $H_{Y(B)}$. Any difference in the magnetic field strength measured by each of first and second magnetic sense elements 142, 144 can be used to determine the magnetic field gradient in a direction parallel to Y-axis 28.

Referring to FIG. 10 in connection with FIG. 9, FIG. 10 shows a graph 146 of a magnetic gradient field distribution 148 in a direction parallel to the sensing axis (i.e., Y-axis 28) for gradient unit 140 and a magnetic gradient field distribution 150 modified in response to a spatial homogeneous interference magnetic field (i.e., sensing axis stray magnetic field 42, $H_{YT}$) directed along Y-axis 28. More particularly, graph 146 depicts relative positions 152 (i.e., displacement relative to an origin) of first and second magnetic sense elements 142, 144 along Y-axis 28 on the horizontal axis and field strength 154 on the vertical axis. As such, graph 146 shows magnetic gradient field distribution 148 without the presence of a magnetic interference field. In the presence of a magnetic interference field (i.e., field sensing axis stray magnetic field 42), graph 146 additionally shows magnetic gradient field distribution 150 modified from the ideal condition represented by magnetic gradient field distribution 148.

In general, multiplication of external magnetic field 26(A) with the sensor sensitivity, S (discussed below), results in a first output signal component 156, labeled $V_{OUTA}(H_{Y(A)})$, represented in FIG. 9. Further, multiplication of sensing axis stray magnetic field 42 with sensor sensitivity, S, results in a first stray field signal component 158, labeled $V_{OUTA}(H_{YT})$, represented in FIG. 9. Therefore, a voltage output signal 160 (generally represented by the term $V_{OUTA}$ in FIG. 10) from first magnetic sense element 142 can be characterized as $V_{OUTA}(H_{Y(A)}+H_{YT})$. Similarly, multiplication of external magnetic field 26(B) with the sensor sensitivity, S (discussed below), results in a second output signal component 162, labeled $V_{OUTB}(H_{Y(B)})$. Again, multiplication of sensing axis stray magnetic field 42 with sensor sensitivity, S, results in a second stray field signal component 164, labeled $V_{OUTB}(H_{YT})$. Therefore, a voltage output signal 166 (generally represented by the term $V_{OUTB}$ in FIG. 10) from second magnetic sense element 144 can be characterized as $V_{OUTB}(H_{Y(B)}+H_{YT})$.

In FIG. 10, a dotted line depicts magnetic gradient field distribution 148 as a linear gradient range and the related field strength 154 that results in voltage output signals 160, 166 at the relative positions of first and second magnetic sense elements 142, 144 in the absence of sensing axis stray magnetic field 42. In FIG. 10, a solid line depicts magnetic gradient field distribution 150 as a linear gradient range and related field strength 154 that results in first and second output voltage signals 160, 166 at the relative positions of first and second magnetic sense elements 142, 144 with an additional spatial homogenous interference magnetic field component, e.g., sensing axis stray magnetic field 42, $H_{YT}$.

In general, output voltages $V_{OUTA}$ and $V_{OUTB}$ (i.e., voltage output signals 160, 166) of first and second magnetic sense elements 142, 144 of gradient unit 140 can be generally described as follows:

$$V_{OUTA} = S \times H_{Y(A)} \qquad (5)$$

$$V_{OUTB} = S \times H_{Y(B)} \qquad (6)$$

S is the sensitivity of the magnetic sense elements and is assumed to be equal for both of first and second magnetic sense elements 142, 144 (e.g., achieved by fabrication accuracy or trimming). Thus, sensing axis stray magnetic field 42, $H_{YT}$, leads to the same voltage shift in both of first and second magnetic sense elements 142, 144 as follows:

$$V_{OUTA}=S\times(H_{Y(A)}+H_{YT})=S\times H_{Y(A)}+S\times H_{YT} \quad (7)$$

$$V_{OUTB}=S\times(H_{Y(B)}+H_{YT})=S\times H_{Y(B)}+S\times H_{YT} \quad (8)$$

Equations (7) and (8) are valid only if magnetic sense elements 142, 144 are linear (i.e., have a linear response curve, for example, by trimming, and are in non-saturation). Therefore, the sensitivity (S) does not depend upon the magnetic field amplitude for the sensing axis magnetic fields. Calculation of a differential output signal for gradient unit 140 entails taking the difference of the two voltage signals and thereby cancelling sensing axis stray field signal components 158, 164, as shown in the following equation:

$$D_{A,B}=V_{OUTB}-V_{OUTA}=(S\times H_{Y(B)}+S\times H_{YT})-(S\times H_{Y(A)}+S\times H_{YT})=S\times(H_{Y(B)}-H_{Y(A)}) \quad (9)$$

As demonstrated in connection with FIGS. 5-8, the implementation of the rotated auxiliary magnetic sense element 62 along with the primary magnetic sense element 60 can counteract, or otherwise cancel, the effects of non-sensing axis stray magnetic field 40. Additionally, the implementation of the gradient unit configuration discussed in connection with FIGS. 9-10 can counteract, or otherwise cancel, the effects of sensing axis stray magnetic fields 42 in magnetoresistive sense elements. Accordingly, configurations described below combine the rotated auxiliary magnetic sense element and the gradient unit configurations to yield magnetoresistive sense elements that are robust against generally homogeneous stray magnetic fields from every direction.

Figure 11:
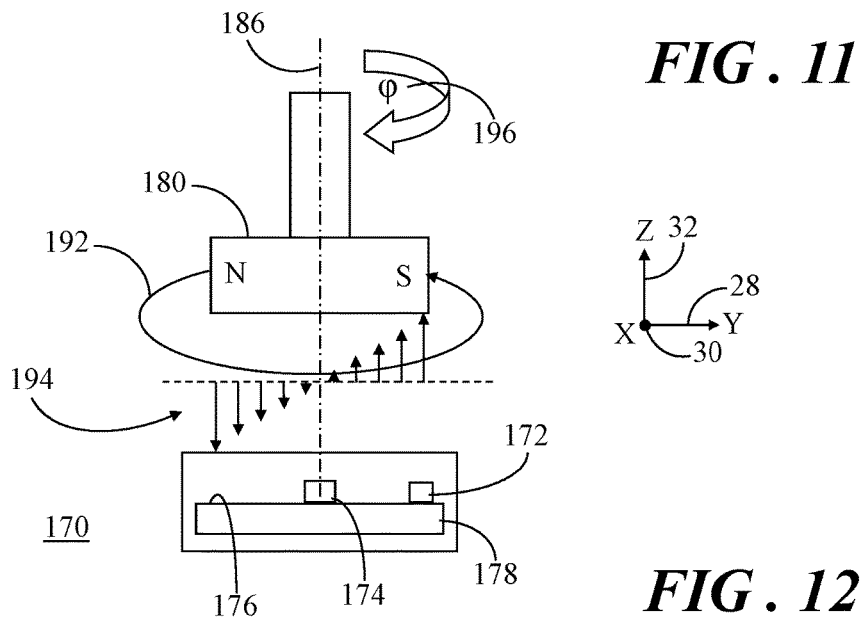
FIG. 11 shows a simplified partial side view of a system for rotation angle sensing.
Figure 12:
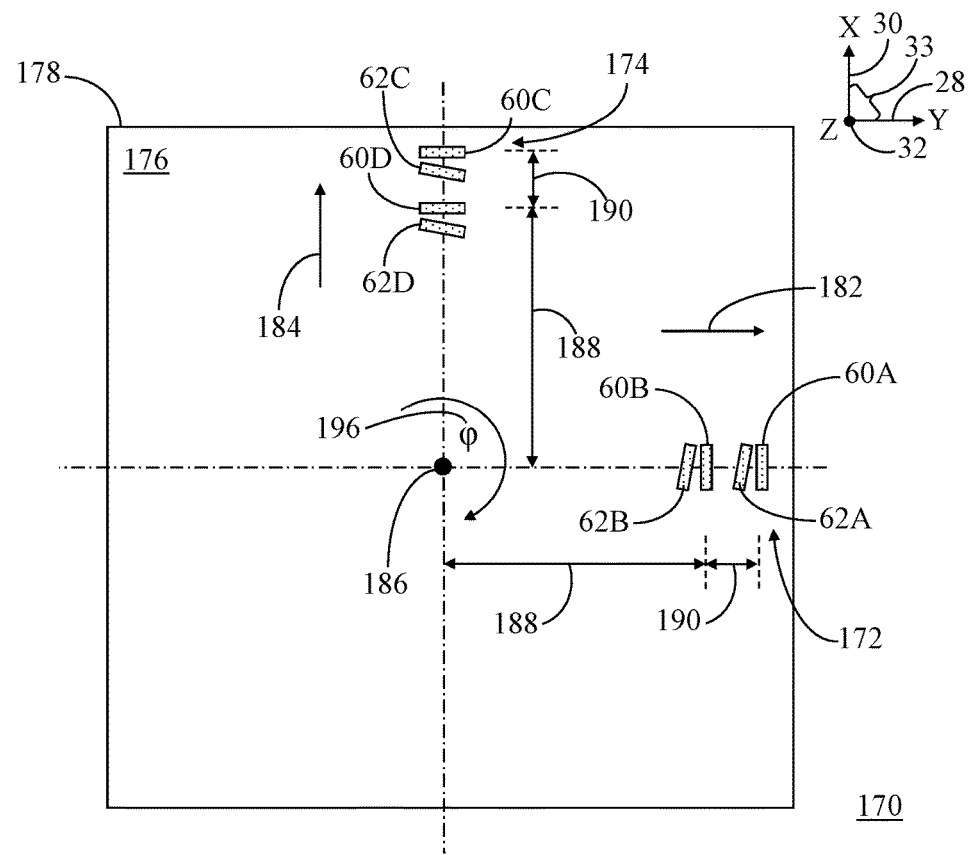
FIG. 12 shows a simplified partial top view of the system of FIG. 11.

Referring now to FIGS. 11-12, FIG. 11 shows a simplified partial side view of a system 170 for rotation angle sensing and FIG. 12 shows a simplified partial top view of system 170. In the embodiment of FIGS. 11-12, primary magnetic sense elements 60 with the rotated auxiliary magnetic sense elements 62 may be suitably configured to sense angular position of an object in a gradiometer configuration.

System 170 generally includes first and second gradient units 172, 174 formed on a surface 176 of a substrate 178 and a magnet 180 vertically displaced away from first and second gradient units 172, 174 along Z-axis 32. Magnet 180 is not shown in the top view illustrated in FIG. 12 in order to better visualize the features formed on surface 176 of substrate 178. First gradient unit 172 includes a first primary magnetic sense element (labeled 60A) and a first auxiliary magnetic sense element (labeled 62A) and a second primary magnetic sense element (labeled 60B) and a second auxiliary magnetic sense element (labeled 62B). Likewise, second gradient unit 174 includes a third primary magnetic sense element (labeled 60C) and a third auxiliary magnetic sense element (labeled 62C) and a fourth primary magnetic sense element (labeled 60D) and a fourth auxiliary magnetic sense element (labeled 62D).

In accordance with an embodiment, second gradient unit 174 is rotated ninety degrees relative to first gradient unit 172. That is, a longitudinal dimension of first and second primary magnetic sense elements, 60A, 60B and first and second auxiliary magnetic sense elements 62A, 62B is aligned with X-axis 30. Additionally, a longitudinal dimension of third and fourth magnetic sense elements, 60C, 60D and third and fourth auxiliary magnetic sense elements 62C, 62D is aligned with Y-axis 28. Thus, first and second primary magnetic sense elements 60A, 60B are configured to sense an in-plane external magnetic field 182 along a first sense axis, i.e., Y-axis 28, oriented approximately parallel to surface 176 of substrate 178. Any difference in the magnetic field strength measured by each of first and second primary magnetic sense elements, 60A, 60B can be used to determine the magnetic field gradient in a direction parallel to Y-axis 28. Third and fourth primary magnetic sense elements 60C, 60D are configured to sense an in-plane measurement magnetic field 184 along a second sense axis, i.e., X-axis 30, oriented approximately parallel to surface 176 of substrate 178. Any difference in the magnetic field strength measured by each of third and fourth primary magnetic sense elements, 60C, 60D can be used to determine the magnetic field gradient in a direction parallel to X-axis 30.

Second gradient unit 174 is spaced apart from first gradient unit 172 by ninety degrees relative to an axis of rotation 186 perpendicular surface 176 of substrate 178. Additionally, first and second gradient units 172, 174 may be located the same radial distance 188 away from axis of rotation 186. Further, first primary magnetic sense element 60A may be laterally spaced apart from second primary magnetic sense element 60B by a distance 190 and third primary magnetic sense element 60C may be laterally spaced apart from fourth primary magnetic sense element 60D by the same distance 190. In other embodiments, the distances between primary magnetic sense elements 60A, 60B, 60C, 60D may differ.

Magnet 180 may be a permanent magnet in the form of, for example, a disc, ring, rectangle, or bar shape. Magnet 180 is configured to rotate about axis of rotation 186 relative to first and second gradient units 172, 174. Magnet 180 produces a magnetic field 192 that rotates along with magnet 180 relative to first and second gradient units 172, 174. Magnetic field 192 has in-plane external magnetic field components 182, 184 and an out-of-plane magnetic field component 194 with gradient properties. Out-of-plane magnetic field component 194 has a magnetic field strength that changes as a function of the distance from axis of rotation 186, as represented by varying length arrows. By way of example, the magnetic field strength may be lowest at locations nearest to axis of rotation 186 and greatest at locations farthest from axis of rotation 186, but inside the magnet dimension.

In an embodiment, out-of-plane magnetic field component 194 is detectable by first and second gradient units 172, 174, and thus may be referred to herein as a magnetic gradient field 194. For example, system 170 may include magnetic field deflection elements, sometimes referred to as flux guides (not shown), that are configured to suitably redirect the out-of-plane magnetic field component 194 into X-Y plane 33 defined by X-axis 30 and Y-axis 28 for detection by primary magnetic sense elements 60A, 60B, 60C, 60D and auxiliary magnetic sense elements 62A, 62B, 62C, 62D.

Out-of-plane magnetic field component 194 detected by first and second gradient units 172, 174, may be suitably processed to identify a rotation angle, 196, labeled φ, of magnet 180 relative to first and second gradient units 172, 174. Although only two gradient units (e.g., first and second gradient units 172, 174) are shown, alternative embodiments may include a multitude of gradient units. In such a configuration, the signals of the opposing gradient unit may be averaged or the like. Thus, possible errors from eccentricity and so forth may be mitigated. The provided example is for a configuration having out-of-plane gradient fields in a non-limiting manner. Alternative embodiments may be implemented with in-plane gradient field components.

Figure 13:
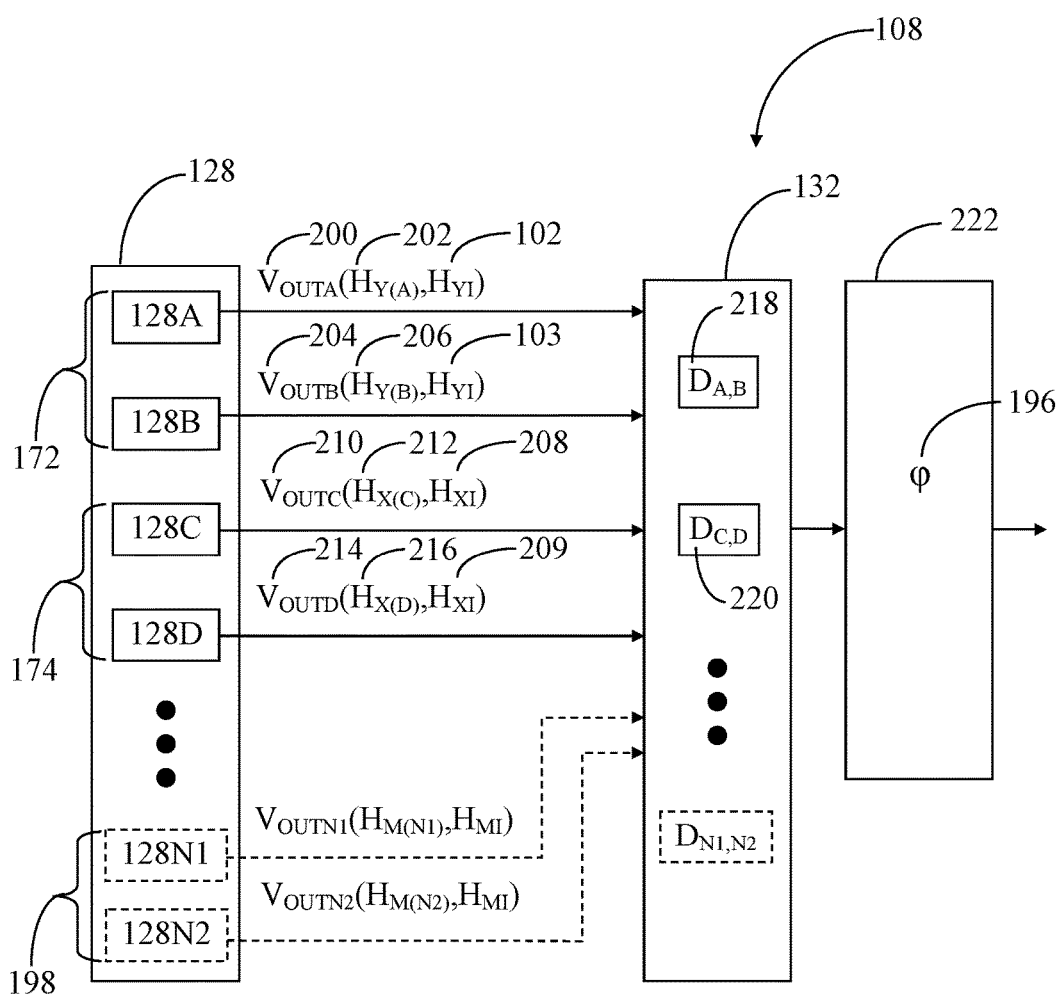
FIG. 13 shows a simplified partial block diagram incorporating a gradient unit configuration for canceling stray magnetic fields along the sensing axis from the sensor response.

Referring to FIG. 13 in connection with FIGS. 11 and 12, FIG. 13 shows a simplified partial block diagram of system 92 incorporating a gradient unit configuration for canceling sensing axis stray magnetic field component 102 from the voltage output signal. The features of FIG. 13 will be described in connection with first and second gradient units 172, 174 of system 170. However, ellipses between second gradient unit 174 and an "Nth" gradient unit 198 indicate that a system may include any predetermined quantity of gradient units in accordance with a particular design configuration. Further, the letter "M" in association with the voltage outputs, $V_{OUTN1}$ and $V_{OUTN2}$, indicates an arbitrary axis. Still further, although two or more gradient units are specifically shown in FIG. 13, another embodiment may only implement a single gradient unit.

FIG. 13 is provided to emphasize that system 92 may be adapted to process multiple sensor signals (e.g., voltage output signals) from multiple magnetic sense elements. In this example, the multiple voltage output signals have been processed through non-sensing axis interference compensation circuitry 128 to thereby largely cancel non-sensing axis stray field signal components resulting from non-sensing axis stray magnetic fields. Accordingly, sensing axis stray magnetic field compensation circuitry 132 may have multiple inputs. For illustrative purposes, a first compensation circuitry section 128A of non-sensing axis interference compensation circuitry 128 is electrically connected to first magnetic sense element 60A of first gradient unit 172 to provide a first voltage output signal 200, $V_{OUTA}$, having an external magnetic field component 202, $H_{Y(A)}$, as a function of in-plane external magnetic field 182 and having sensing axis stray magnetic field component 102. Similarly, a second compensation circuitry section 128B of non-sensing axis interference compensation circuitry 128 is electrically connected to second magnetic sense element 60B of first gradient unit 172 to provide a second voltage output signal 204, $V_{OUTB}$, having an external magnetic field component 206, $H_{Y(B)}$, as a function of in-plane external magnetic field 182 and having sensing axis stray magnetic field component 102, 103.

It should be recalled from FIG. 12 that third and fourth primary magnetic sense elements 60C and 60D are configured to sense in-plane external magnetic field 184 along a second sense axis, i.e., X-axis 30, oriented approximately parallel to surface 176 of substrate 178. Thus, voltage output signals from third and fourth primary magnetic sense elements 60C and 60D may include a sensing axis stray magnetic field component 208, 209, labeled $H_{XT}$, aligned with X-axis 30. Again, for illustrative purposes, a third compensation circuitry section 128C of non-sensing axis interference compensation circuitry 128 is electrically connected to third primary magnetic sense element 60C of second gradient unit 174 to provide a third voltage output signal 210, $V_{OUTC}$, having an external magnetic field component 212, $H_{X(C)}$, as a function of in-plane external magnetic field 184 and having sensing axis stray magnetic field component 208. Similarly, a fourth compensation circuitry section 128D of non-sensing axis interference compensation circuitry 128 is electrically connected to fourth primary magnetic sense element 60D of second gradient unit 174 to provide a fourth voltage output signal 214, $V_{OUTC}$, having an external magnetic field component 216, $H_{X(D)}$, as a function of in-plane external magnetic field 184 and having sensing axis stray magnetic field component 209.

Thus, each of the voltage output signals 200, 204, 210, 214 is a function of an external magnetic field signal component and a sensing axis stray magnetic field signal component. More particularly, each of the voltage output signals is a summation of the external magnetic field signal component and the sensing axis stray field signal component, as shown in equations (7) and (8). Still further, sensing axis stray magnetic field signal component 102, 103 along the first sensing axis, e.g., Y-axis 28, may differ from sensing axis stray magnetic field signal component 208, 209 along the second sensing axis, e.g., X-axis 30.

Sensing axis stray magnetic field compensation circuitry 132 is electrically coupled with first gradient unit 172 and is configured to produce a first differential output signal 218 ($D_{A,B}$) as a difference between first and second voltage output signals 200, 204 in accordance with equations (5) through (9) described above. Likewise, sensing axis stray magnetic field compensation circuitry 132 is electrically coupled with second gradient unit 174 and is configured to produce a second differential output signal 220 ($D_{C,D}$) as a difference between third and fourth voltage output signals 210, 214. Of course, depending upon the configuration of gradient units, a multiplicity of differential output signals may be computed, as represented by $D_{N1,N2}$. Second differential output signal 220 may be computed as follows:

$$V_{OUTC} = S \times H_{X(C)} \quad (10)$$

$$V_{OUTD} = S \times H_{X(D)} \quad (11)$$

S is the sensitivity of the magnetic sense elements and is assumed to be equal for both of third and fourth primary magnetic sense elements 60C, 60D (e.g., achieved by fabrication accuracy or trimming). Thus, sensing axis stray magnetic field 208, $H_{XT}$, leads to the same voltage shift in both of third and fourth magnetic sense elements 60C, 60D as follows:

$$V_{OUTC} = S \times (H_{X(C)} + H_{XT}) = S \times H_{X(C)} + S \times H_{XT} \quad (12)$$

$$V_{OUTD} = S \times (H_{X(D)} + H_{XT}) = S \times H_{X(D)} + S \times H_{XT} \quad (13)$$

Accordingly, calculation of a differential output signal for second gradient unit 174 entails taking the difference of the two voltage signals and thereby cancelling sensing axis stray field signal component 228, as follows:

$$D_{C,D} = V_{OUTD} - V_{OUTC} = (S \times H_{X(D)} + S \times H_{XT}) - (S \times H_{X(C)} + S \times H_{XT}) = S \times (H_{X(D)} - H_{X(C)}) \quad (14)$$

Referring to FIGS. 11-13, processing circuit 108 may include rotation angle determination circuitry 222. By way of example, rotation angle determination circuitry 222 includes a combination of structural and software configured components to determine rotation angle 196 in accordance with the configuration of system 170 shown in FIGS. 11-12. In general, the magnetic field gradient, e.g., for out-of-plane magnetic field components 194 (FIG. 11), at the position of first and second magnetic sense elements 60A, 60B of first gradient unit 172 can be described as:

$$H_{Y(A)} = H_{mA} \times \sin \varphi \quad (15)$$

$$H_{Y(B)} = H_{mB} \times \sin \varphi \quad (16)$$

In equations (15) and (16) and the subsequent equations (17) and (18), $H_m$ represents the amplitude of the redirected/deflected in-plane external magnetic field. Due to the ninety-degree rotated arrangement of first and second gradient units 172, 174, the mathematical relationship of third and fourth magnetic sense elements 60C, 60D of second gradient unit 174 can be described as:

$$H_{X(C)} = H_{mA} \times \cos \varphi \quad (17)$$

$$H_{X(D)} = H_{mB} \times \cos \varphi \quad (18)$$

The magnetic field gradient for first gradient unit 172 can therefore be described as:

$$H_{Y(B)} - H_{Y(A)} = H_{mB} \times \sin \varphi - H_{mA} \times \sin \varphi = (H_{mB} - H_{mA}) \times \sin \varphi = H_{mG1} \times \sin \varphi \quad (19)$$

The operator $H_{mG1}$ is equal to $(H_{mB} - H_{mA})$. Similarly, the magnetic field gradient for second gradient unit 174 can be described as:

$$H_{X(D)} - H_{X(C)} = H_{mB} \times \cos \varphi - H_{mA} \times \cos \varphi = (H_{mB} - H_{mA}) \times \cos \varphi = H_{mG1} \times \cos \varphi \quad (20)$$

By substituting equation (19) into equation (9), first differential output voltage 218, $D_{A,B}$, can be determined as follows:

$$D_{A,B} = S \times H_{mG1} \times \sin \varphi \quad (21)$$

By substituting equation (20) into equation (14), second differential output voltage 220, $D_{C,D}$, can be determined as follows:

$$D_{C,D} = S \times H_{mG1} \times \cos \varphi \quad (22)$$

Thus, the angular position (i.e., rotation angle 196) φ, can be calculated at rotation angle determination circuitry 222 by division of the differential output voltages 218, 220, $D_{A,B}$ and $D_{C,D}$, as follows:

$$\frac{D_{A,B}}{D_{C,D}} = \frac{S \times H_{mG1} \times \sin\varphi}{S \times H_{mG1} \times \cos\varphi} = \tan\varphi \quad (23)$$

And:

$$\varphi = \arctan \frac{D_{A,B}}{D_{C,D}} \quad (24)$$

Figure 14:
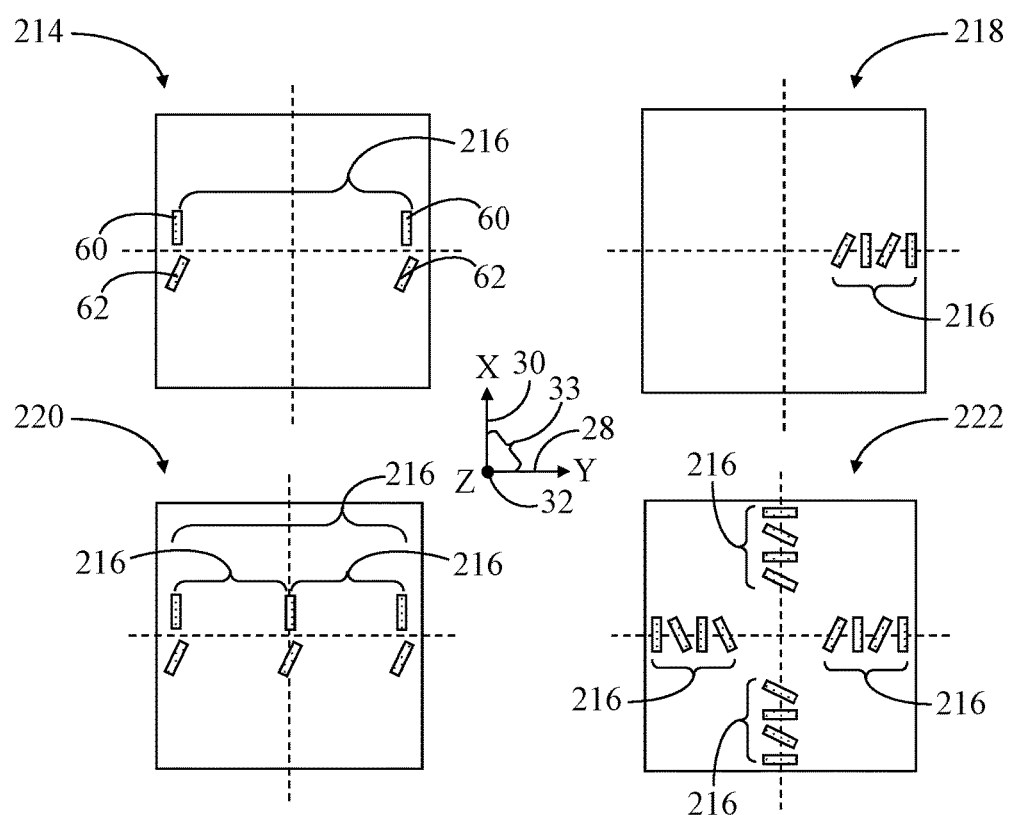
FIG. 14 shows various simplified top views showing positions of gradient units that may alternatively be incorporated into the system of FIGS. 11-12.

Referring now to FIG. 14, FIG. 14 shows various simplified top views showing positions of gradient units that may alternatively be incorporated into the system of FIGS. 11-12. As mentioned previously, alternative embodiments of system 170 may include a multitude of gradient units. Further, these gradient units may be arranged differently. Each of the configurations of gradient units shown in FIG. 14 include primary magnetic sense elements 60 and auxiliary magnetic sense elements 62, both of which are formed in the same structural layer, and with auxiliary magnetic sense elements 62 located adjacent to the corresponding primary magnetic sense elements 60 in a one-to-one configuration. Alternative embodiments (discussed in connection with FIG. 18) may include more than one primary magnetic sense element 60 and only a single auxiliary magnetic sense element 62.

FIG. 14 includes a first configuration 214 having two primary magnetic sense elements 60 with two auxiliary magnetic sense elements 62 that are widely spaced apart along the sensing axis (e.g., Y-axis 28) but form a single gradient unit 216. Additionally, a second configuration 218 includes two primary magnetic sense elements 60 and two auxiliary magnetic sense elements 62 that are closely spaced apart along the sensing axis (e.g., Y-axis 28) and form a single gradient unit 216. A third configuration 220 includes three primary magnetic sense elements 60 and three auxiliary magnetic sense elements 62 that are spaced apart along the sensing axis (Y-axis 28). In third configuration 220, one of the magnetic sense elements 60 may be located at the center point and the remaining two magnetic sense elements 60 are spaced on opposite sides of and at an equal distance from the center point. Various pairs of magnetic sense elements 60 can be formed to yield three gradient units 216, as shown. A fourth configuration 222 has four gradient units 216 each separated by 90°.

Figure 15:
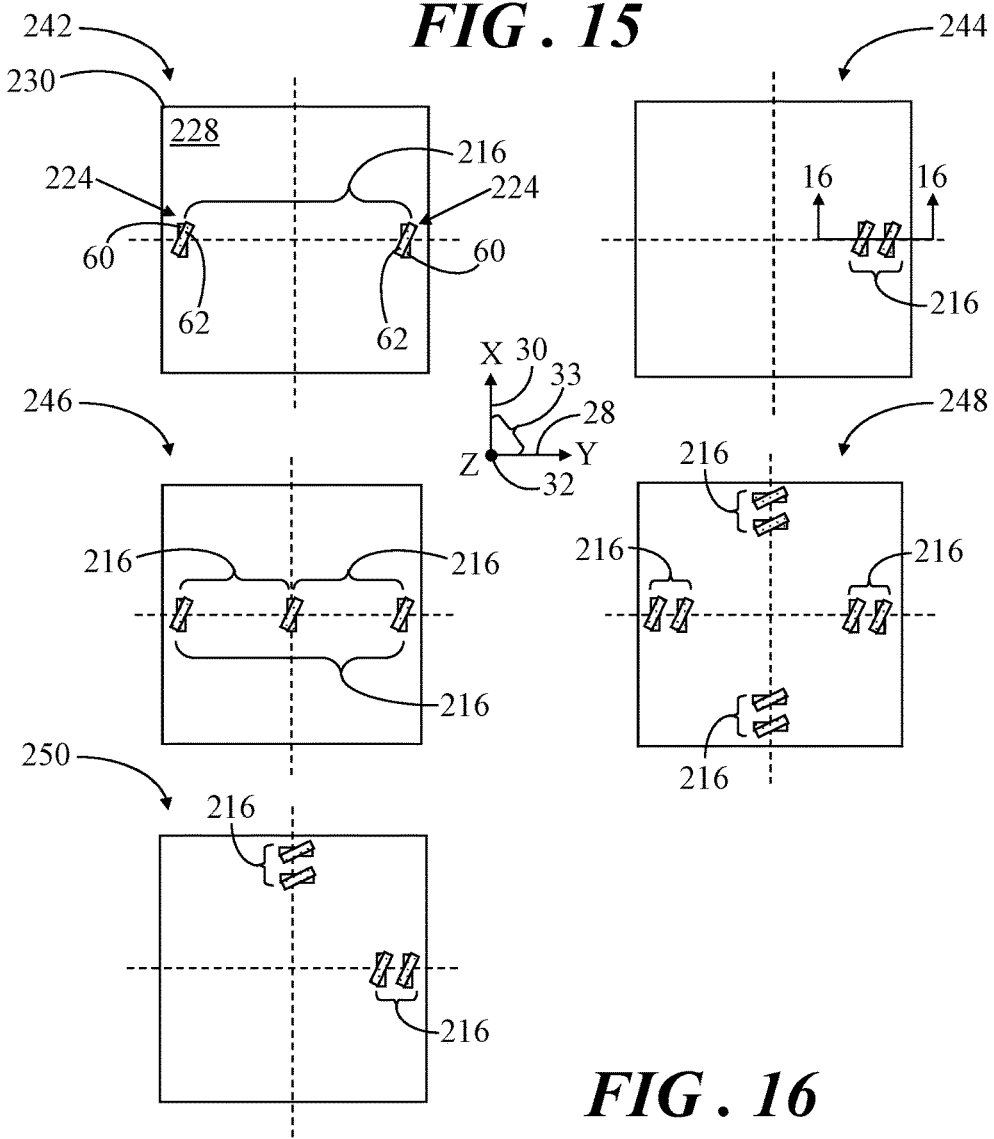
FIG. 15 shows various simplified top views showing additional positions of gradient units that may alternatively be incorporated into the system of FIGS. 11-12.
Figure 16:
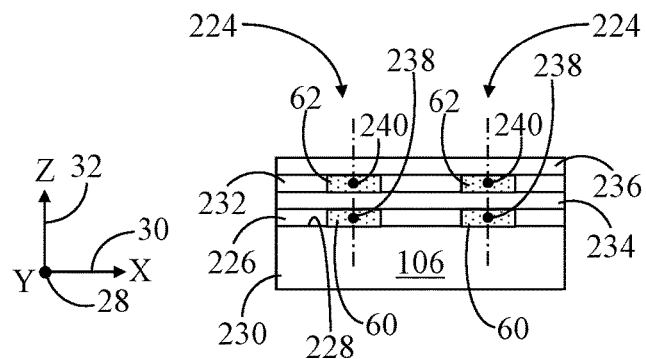
FIG. 16 shows a partial side sectional view of one of the gradient unit configurations along section lines 16-16 of FIG. 15.

Referring to FIGS. 15-16, FIG. 15 shows various simplified top views showing additional positions of gradient units that may alternatively be incorporated into the system of FIGS. 11-12, and FIG. 16 shows a partial side sectional view of one of the gradient unit configurations along section lines 16-16 of FIG. 15. The configurations presented in FIG. 14 depicted auxiliary magnetic sense elements 62 formed in the same structural layer as primary magnetic sense elements 60. Further, each of the auxiliary magnetic sense elements 62 was immediately adjacent to a corresponding one of the primary magnetic sense elements 60. In the alternative configurations presented in FIGS. 15-16, the primary magnetic sense elements 60 and auxiliary magnetic sense elements 62 are arranged in a stacked configuration 224.

As shown, primary magnetic sense elements 60 may be formed in a first structural layer 226 on a planar surface 228 of a substrate 230. Substrate 230 may include ASIC 106 discussed above in connection with FIG. 8. The corresponding auxiliary magnetic sense elements 62 may be formed in a second structural layer 232 that may be spatially separated from first structural layer 226 by, for example, an electrically insulating layer 234. In some structures, another electrically insulating layer 236 may overlie second structural layer 232. Additionally, primary and auxiliary magnetic sense elements 60, 62 may be arranged in stacked configuration 224 such that a first center point 238 of primary magnetic sense element 60 is aligned with a second center point 240 of auxiliary magnetic sense element 62 along Z-axis 32 that is perpendicular to planar surface 228 of substrate 230.

Stacked configuration 224 may be achieved by a stacked processing methodology, an interleaved in-plane geometry, or without stacked processing. In stacked configuration 224, corresponding primary and auxiliary magnetic sense elements 60, 62 may be subject to substantially the same magnetic field behavior. Additionally, stacked configuration 224 may facilitate a decrease in the system size relative to the adjacently located primary and auxiliary magnetic sense elements 60, 62 shown in FIGS. 12 and 14. Although primary magnetic sense elements 60 are depicted as being located in first structural layer 226 closest to surface 228 of substrate 230, in alternative embodiments, auxiliary magnetic sense elements 62 may be fabricated in first structural layer 226 and primary magnetic sense elements 60 may be fabricated in second structural layer 232 in a stacked configuration. Further, each of first and second structural layers may include multiple material sub-layers that combine to form the specific first or second structural layer.

Accordingly, FIG. 15 includes a fifth configuration 242 having two primary magnetic sense elements 60 with two auxiliary magnetic sense elements 62 arranged in stacked configuration 224 that are widely spaced apart along the sensing axis (e.g., Y-axis 28) but form a single gradient unit 216. Additionally, a sixth configuration 244 includes two primary magnetic sense elements 60 and two auxiliary magnetic sense elements 62 in stacked configuration 224 that are closely spaced apart along the sensing axis (e.g., Y-axis 28) and form a single gradient unit 216. A seventh configuration 246 includes three primary magnetic sense elements 60 and three auxiliary magnetic sense elements 62, arranged in stacked configuration 224, that are spaced apart along the sensing axis (Y-axis 28). In seventh configuration 246, one of the magnetic sense elements 60 may be located at the center of substrate 230 and the remaining two magnetic sense elements 60 are spaced on opposite sides of and at an equal distance from the center point. Various pairs of magnetic sense elements 60 can be formed to yield three gradient units 216, as shown. An eighth configuration 248 has four gradient units 216 each separated by 90°, and a ninth configuration 250 has two gradient units 216 separated by 90°.

Figure 17:
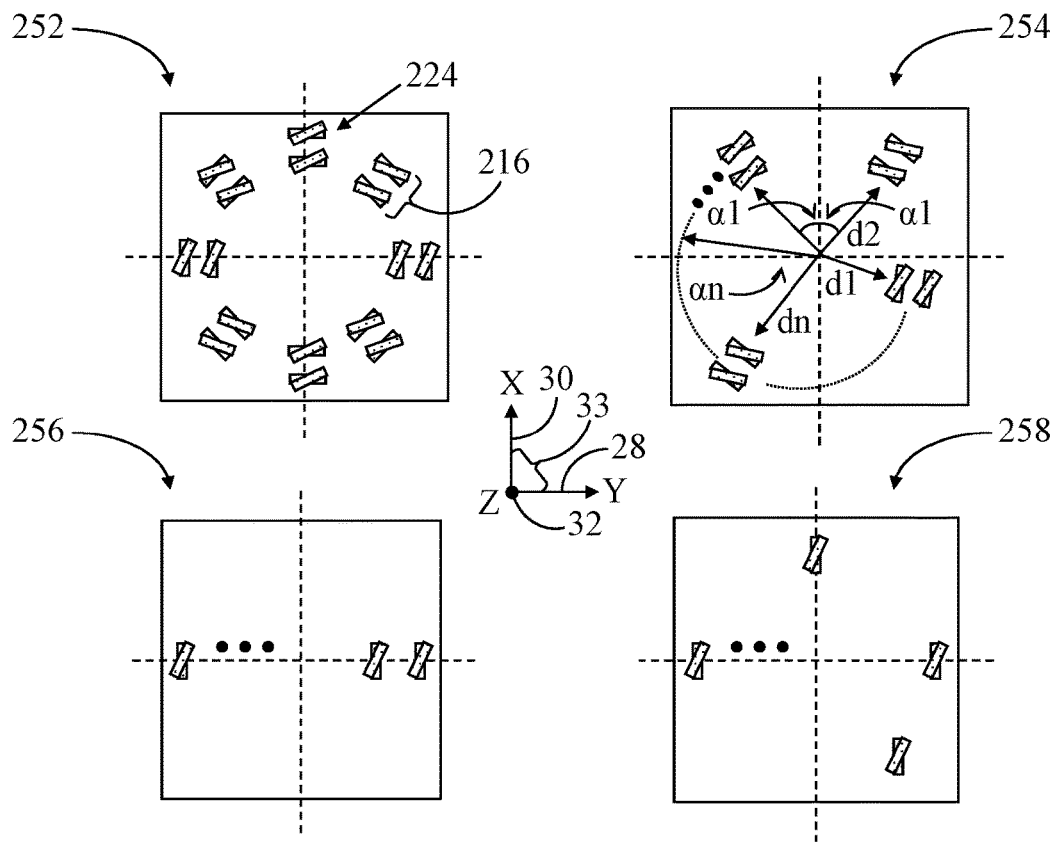
FIG. 17 shows various simplified top views showing still more positions of gradient units that may alternatively be incorporated into the system of FIGS. 11-12.

FIG. 17 shows various simplified top views showing still more positions of gradient units 216 that may alternatively be incorporated into the system of FIGS. 11-12. The space savings achieved using stacked configuration 224 of primary magnetic sense element 60 and auxiliary magnetic sense element 62 may be exploited to incorporate a multiplicity of gradient units in a multiplicity of locations on planar surface 228 of substrate 230.

In FIG. 17, a tenth configuration 252 is shown having eight gradient units 216 in stacked configuration 224, each separated by 45°. An eleventh configuration 254 is shown having gradient units 216 in which the angles (e.g., a1, a2, and an) from parallel to the axes and the distances (d1, d2, dn) from the center can be different. In a twelfth configuration 256, multiple pairs of primary magnetic sense elements 60 and auxiliary magnetic sense elements 62 that are laterally shifted along the Y-axis 28 (sensing axis) with the same distance between each magnetic sense element 60, thereby forming a multiplicity of gradient units 216. In a thirteenth configuration 258, distances vary and pairs of primary and auxiliary magnetic sense elements 60, 62 can be laterally shifted along X-axis 30 and/or Y-axis 28 to yield multiple gradient units 216. FIGS. 12, 14, 15, and 17 only show a few configurations of gradient units. Other configurations may be equivalently applicable.

FIG. 18 shows a top view of magnetic sense elements in accordance with another embodiment. In particular, FIG. 18 shows two primary magnetic sense elements 60 and a single auxiliary magnetic sense element 62, in which the magnetization direction of the sense layer is rotated in plane 33 relative to both of the illustrated primary sense elements 60. In such a configuration, each of the two primary magnetic sense elements 60 may produce voltage output signals 260, 262 (labeled $V_{OUTA}$ and $V_{OUTB}$, respectively) and the single auxiliary magnetic sense element 62 may produce a voltage output signal 264 (labeled $V_{AUX-OUT}$). Processing circuit 108 (FIG. 8) may be adapted to receive voltage output signals 260, 262, 264 and apply the derived correction factors 126 (FIG. 8) to both of voltage output signals 260, 262 to produce two resultant output signals in which the non-sensing axis interference field (e.g., non-sensing axis stray magnetic field 40) is substantially removed from each of the two resultant output signals.

The configuration of two primary magnetic sense elements 60 and a single auxiliary magnetic sense element 62 may be incorporated into a gradient unit configuration, although such a configuration is not a limitation. By way of example, the configuration of two primary magnetic sense elements 60 and a single auxiliary magnetic sense element 62 may be incorporated in rotational speed sensor systems, as will be discussed below. Further, alternative configurations may have more than two primary magnetic sense elements 60 associated with a single auxiliary magnetic sense element 62.

FIG. 19 shows a simplified partial side view of a system 266 for rotational speed measurement incorporating the magnetic sense elements of FIG. 18. In particular, system 266 includes primary magnetic sense elements 60 with at least one auxiliary magnetic sense element 62, in which its magnetization direction is rotated relative to primary magnetic sense elements 60. In this example, system 266 includes a magnetized encoder wheel 268 for generating a magnetic field, although alternative embodiments may implement a ferromagnetic gear wheel (see FIG. 20) or other similar structure. The presented north (N) and south (S) pole configuration shown in FIG. 19 is one example of an encoder wheel.

In this example configuration, primary magnetic sense elements 60 are configured to measure rotational speed of encoder wheel 268. Thus, primary and auxiliary magnetic sense elements 60, 62 are aligned with Y-axis 28 to detect external magnetic field 26 along the sensing axis (e.g., Y-axis 28) generated as the alternating magnetic north and south poles of encoder wheel 268 as they pass by during rotation of encoder wheel 262. Each of primary magnetic sense elements 60 converts the pole-sequence into a sinusoidal-like output voltage, and the rotational speed of encoder wheel 268 may be derived by counting, for example, the zero crossings. A bias magnet (not shown) may be used to adjust the sensitivity and measurement range of primary and auxiliary magnetic sense elements 62. Auxiliary magnetic sense element 62 is implemented herein to compensate for non-sensing axis stray magnetic field 40 (FIG. 2) along the non-sensing axis, e.g., X-axis 30, as discussed in detail above.

FIG. 19 does not show primary and auxiliary magnetic sense elements 60, 62 in a packaged form and attached to a corresponding structure for simplicity of illustration. Rather, primary and auxiliary magnetic sense elements 60, 62 are shown displaced away from encoder wheel 268 relative to Z-axis 32 of the three-dimensional coordinate system. In an actual configuration, it should be readily apparent that magnetic sense elements 60 will be packaged and attached to a support structure in suitable proximity to encoder wheel 268. Further, primary and auxiliary magnetic sense element 60, 62 are visible in FIG. 19 for illustrative purposes. In an actual configuration, one or more primary magnetic sense elements 60 may be laterally displaced away from auxiliary magnetic sense element(s) 62 along X-axis. In such a configuration, auxiliary magnetic sense elements 62 would be in front of or behind primary magnetic sense elements 60 so that one or the other would not be visible in the orientation of FIG. 19. Still further, two primary magnetic sense elements 60 and a single auxiliary magnetic sense element 62 are shown for simplicity. These magnetic sense elements 60, 62 may be arranged as gradient units. Alternatively, output signals from each of magnetic sense elements 60 may be combined via, for example, summation to enhance the accuracy of system 260 to external magnetic field 26.

FIG. 19 only shows a simplified configuration of a rotational speed measurement system. Other configurations may be equivalently applicable. Further, other systems may be envisioned that include magnetic sense elements with auxiliary magnetic sense elements positioned proximate the primary magnetic sense elements for providing auxiliary sensor signals along the sensing axis and utilizing the auxiliary sensor signals to compensate for non-sensing axis stray magnetic fields along the non-sensing axis.

FIG. 20 shows a simplified partial side view of another system 270 for rotational speed measurement. System 264 includes many of the structural features described in connection with system 266 (FIG. 19). Thus, a description of those features will not be repeated for brevity. In the configuration of system 270, an unmagnetized passive ferromagnetic encoder wheel 272 is implemented, in which case, a bias magnet (not shown) may be used to magnetize the passive ferromagnetic encoder wheel 272.

Embodiments described herein entail magnetic field sensors and systems incorporating the magnetic field sensors for measuring magnetic fields while substantially cancelling the influence of stray magnetic fields along one or more axes. An embodiment of a system comprises a first magnetic sense element configured to produce a first output signal in response to an external magnetic field directed along a sensing axis parallel to a plane of the first magnetic sense element, the first magnetic sense element having a first magnetization direction. The system further comprises a second magnetic sense element having a second magnetization direction that is rotated in the plane relative to the first magnetization direction, the second magnetic sense element being configured to produce a second output signal in response to the external magnetic field, wherein the second output signal differs from the first output signal in dependency to a magnetic interference field directed along a non-sensing axis of the first magnetic field. The system further comprises a processing circuit coupled with the first and second magnetic sense elements, wherein the processing circuit is configured to receive the first and second output signals, identify from a relationship between the first and second output signals an influence of the magnetic interference field on the first output signal, and apply a correction factor to the first output signal to produce a resultant output signal in which the influence of the magnetic interference field is substantially removed.

An embodiment of a method comprises producing a first output signal at a first magnetic sense element in response to an external magnetic field directed along a sensing axis parallel to a plane of the first magnetic sense element, the first magnetic sense element having a first magnetization direction, producing a second output signal at a second magnetic sense element in response to the external magnetic field, the second magnetic sense element having a second magnetization direction that is rotated in the plane relative to the first magnetization direction, wherein the second output signal differs from the first output signal in dependency to a magnetic interference field directed along a non-sensing axis of the first magnetic field, and receiving the first and second output signals at a processing circuit. The method further comprises at the processing circuit, identifying from a relationship between the third and fourth output signals an influence of the magnetic interference field on the first magnetic field signal component and applying a correction factor to the first output signal to produce a resultant output signal in which the influence of the magnetic interference field is substantially removed.

Another embodiment of a system comprises a substrate, a first magnetoresistive element formed on the substrate, the first magnetoresistive element being configured to produce a first output signal in response to an external magnetic field directed along a sensing axis, the first magnetoresistive element having a first magnetization direction, and a second magnetoresistive element formed on the substrate and having a second magnetization direction that is rotated parallel to the planar surface relative to the first magnetization direction, the second magnetoresistive element being configured to produce a second output signal in response to the external magnetic field, wherein the second output signal differs from the first output signal in dependency to a magnetic interference field directed along a non-sensing axis of the first magnetic field, the sensing and non-sensing axes are parallel to a planar surface of the substrate, and the non-sensing axis is perpendicular to the sensing axis. The system further comprises a processing circuit coupled with the first and second magnetoresistive elements, wherein the processing circuit is configured to receive the first and second output signals, identify from the second output signal an influence of the magnetic interference field on the first output signal, and apply a correction factor to the first output signal to produce a resultant output signal in which the influence of the magnetic interference field is substantially removed.

Thus, a system includes one or more primary magnetic field sense elements and one or more auxiliary magnetic field sense elements located in proximity to the primary magnetic field sense elements. The auxiliary magnetic field sense elements are rotated in a plane relative to the primary magnetic field sense elements. More particularly, the magnetization direction of the auxiliary magnetic field sense elements is rotated in the plane relative to the magnetization direction of the primary magnetic field sense elements. Setting auxiliary sensor signals output from the auxiliary magnetic field sense elements in relation with primary sensor signals output from the primary magnetic field sense elements enables the extraction of the magnetic field strength of stray magnetic fields along a non-sensing axis. Knowledge of this field strength can be used to compensate for, or otherwise cancel, an adverse signal contribution resulting from the stray magnetic field along a non-sensing axis. The primary and auxiliary magnetic sense elements may be incorporated in a gradient unit approach which additionally enables cancellation of an adverse signal contribution resulting from a homogeneous (i.e., uniform) stray magnetic field along the sensing axis. Thus, a uniaxial (i.e., single-axis) magnetic sense element may effectively be achieved. One or more magnetic field sense elements with one or more auxiliary sense elements can be implemented in various system configurations for purposes of speed and direction sensing, rotation angle sensing, proximity sensing, and the like.

This disclosure is intended to explain how to fashion and use various embodiments in accordance with the invention rather than to limit the true, intended, and fair scope and spirit thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system comprising:
 a first magnetic sense element configured to produce a first output signal in response to an external magnetic field directed along a sensing axis parallel to a plane of the first magnetic sense element, the first magnetic sense element having a first magnetization direction;
 a second magnetic sense element having a second magnetization direction that is rotated in the plane relative to the first magnetization direction, the second magnetic sense element being configured to produce a second output signal in response to the external magnetic field, wherein the second output signal differs from the first output signal in dependency to a magnetic interference field directed along a non-sensing axis of the first magnetic field; and a processing circuit coupled with the first and second magnetic sense elements, wherein the processing circuit is configured to receive the first and second output signals, identify from a relationship between the first and second output signals an influence of the magnetic interference field on the first output signal, and apply a correction factor to the first output signal to produce a resultant output signal in which the influence of the magnetic interference field is substantially removed.

2. The system of claim 1 wherein the first and second magnetic sense elements are formed on a substrate, the plane is aligned with a layer magnetization of the first and second magnetic sense elements, the plane is parallel to a planar surface of the substrate, the sensing and non-sensing axes are parallel to the planar surface, and the non-sensing axis is perpendicular to the sensing axis.

3. The system of claim 1 wherein each of the first and second magnetic sense elements is characterized as a magnetoresistive element.

4. The system of claim 1 further comprising a substrate, wherein the first and second magnetic sense elements are formed in the same structural layer on the substrate.

5. The system of claim 1 further comprising a substrate, wherein the first magnetic sense element is formed in a first structural layer on the substrate and the second magnetic sense element is formed in a second structural layer arranged in a stacked configuration with the first structural layer.

6. The system of claim 5 wherein the first magnetic sense element has a first center point and the second magnetic sense element has a second center point, the first and second center points being arranged such that the first and second center points are aligned with one another along another axis that is perpendicular to the plane of the system.

7. The system of claim 1 wherein the processing circuit comprises:
   an extraction element configured to receive the first and second output signals and compute a quotient value as a ratio of the first output signal to the second output signal;
   a correction factor computation element configured to utilize the quotient value to determine the correction factor; and
   a compensation element coupled with each of the first magnetic sense element and the correction factor computation element, the compensation element being configured to apply the correction factor to the first output signal.

8. The system of claim 7 wherein the quotient value is distinct for one of a plurality of magnetic interference fields along the non-sensing axis and is dependent upon a magnetic field strength of the external magnetic field.

9. The system of claim 1 further comprising a third magnetic sense element configured to produce a third output signal in response to the external magnetic field, the third magnetic sense element having a third magnetization direction, wherein the second magnetization direction of the second magnetic sense element is rotated in the plane relative to both of the first and third magnetization directions, wherein the third output signal differs from the second output signal in the presence of the magnetic interference field, and wherein the processing circuit is further configured to receive the third output signal and apply the correction factor or another correction factor to the third output signal to produce a second resultant output signal in which the influence of the magnetic interference field is substantially removed.

10. The system of claim 1 further comprising:
   a third magnetic sense element configured to produce a third output signal in response to the external magnetic field, the third magnetic sense element having a third magnetization direction; and
   a fourth magnetic sense element having a fourth magnetization direction rotated in the plane relative to the third magnetization direction, the fourth magnetic sense element being configured to produce a fourth output signal in response to the external magnetic field, wherein the fourth output signal differs from the third output signal in dependency to the magnetic interference field directed along the non-sensing axis of the third magnetic sense element, and the processing circuit is further configured to receive the third and fourth output signals, identify from a relationship between the third and fourth output signals an influence of the magnetic interference field on the third output signal, and apply a second correction factor to the third output signal to produce a second resultant output signal in which the influence of the magnetic interference field is substantially removed.

11. The system of claim 1 wherein:
the magnetic interference field is a first magnetic interference field;
the system further comprises a third magnetic sense element configured to produce a third output signal in response to the external magnetic field along the sensing axis;
the first and third magnetic sense elements are subject to a second magnetic interference field along the sensing axis; and
the processing circuit is further configured to produce a differential output signal as a difference between the first and third output signals, the difference between the first and third output signals substantially removing the second magnetic interference field.

12. The system of claim 11 wherein:
the resultant output signal indicative of the first output signal is a first resultant output signal;
the third magnetic sense element has a third magnetization direction;
the second magnetization direction of the second magnetic sense element is rotated in the plane relative to both of the first and third magnet directions; and
the processing circuit is further configured to receive the third output signal, apply the correction factor or another correction factor to the third output signal to produce a second resultant output signal in which the influence of the first magnetic interference field is substantially removed, and produce the differential output signal as the difference between the first resultant output signal indicative of the first output signal and the second resultant output signal indicative the third output signal.

13. The system of claim 11 wherein:
the resultant output signal is a first resultant output signal;
the system further comprises a fourth magnetic sense element having a fourth magnetization direction that is rotated in the plane relative to the third magnetization direction, the fourth magnetic sense element being configured to produce a fourth output signal in response to the external magnetic field, wherein the fourth output signal differs from the third output signal in dependency to the first magnetic interference field; and the processing circuit is further configured to receive the third and fourth output signals, identify from a relationship between the third and fourth output signals an influence of the magnetic interference field on the third output signal, apply a second correction factor to the third output signal to produce a second resultant output signal in which the influence of the magnetic interference field is substantially removed, and produce the differential output signal as the difference between the first resultant output signal indicative of the first output signal and the second resultant output signal indicative the third output signal.

14. A method comprising:

producing a first output signal at a first magnetic sense element in response to an external magnetic field directed along a sensing axis parallel to a plane of the first magnetic sense element, the first magnetic sense element having a first magnetization direction;

producing a second output signal at a second magnetic sense element in response to the external magnetic field, the second magnetic sense element having a second magnetization direction that is rotated in the plane relative to the first magnetization direction, wherein the second output signal differs from the first output signal in dependency to a magnetic interference field directed along a non-sensing axis of the first magnetic field;

receiving the first and second output signals at a processing circuit;

at the processing circuit, identifying from a relationship between the third and fourth output signals an influence of the magnetic interference field on the first magnetic field signal component and applying a correction factor to the first output signal to produce a resultant output signal in which the influence of the magnetic interference field is substantially removed.

15. The method of claim 14 further comprising:

computing, at the processing circuit, a quotient value as ratio of the first output signal to the second output signal; and utilizing, at the processing circuit, the quotient value to determine the correction factor, wherein the quotient value is distinct for one of a plurality of magnetic interference fields along the non-sensing axis and is dependent upon a magnetic field strength of the external magnetic field.

16. A system comprising:

a substrate;

a first magnetoresistive element formed on the substrate, the first magnetoresistive element being configured to produce a first output signal in response to an external magnetic field directed along a sensing axis, the first magnetoresistive element having a first magnetization direction;

a second magnetoresistive element formed on the substrate and having a second magnetization direction that is rotated parallel to the planar surface relative to the first magnetization direction, the second magnetoresistive element being configured to produce a second output signal in response to the external magnetic field, wherein the second output signal differs from the first output signal in dependency to a magnetic interference field directed along a non-sensing axis of the first magnetic field, the sensing and non-sensing axes are parallel to a planar surface of the substrate, and the non-sensing axis is perpendicular to the sensing axis; and a processing circuit coupled with the first and second magnetoresistive elements, wherein the processing circuit is configured to receive the first and second output signals, identify from the second output signal an influence of the magnetic interference field on the first output signal, and apply a correction factor to the first output signal to produce a resultant output signal in which the influence of the magnetic interference field is substantially removed.

17. The system of claim 16 wherein the first and second magnetoresistive elements are formed in the same structural layer on the substrate.

18. The system of claim 16 wherein the first magnetoresistive element is formed in a first structural layer on the substrate and the second magnetoresistive element is formed in a second structural layer arranged in a stacked configuration with the first structural layer.

19. The system of claim 16 further comprising a third magnetoresistive element formed on the substrate, the third magnetoresistive element being configured to produce a third output signal in response to the external magnetic field, the third magnetoresistive element having a third magnetization direction, the second magnetization direction being rotated parallel to the planar surface relative to both of the first and third magnetization directions, wherein the processing circuit is further configured to receive the third output signal and apply the correction factor to the third output signal to produce a second resultant output signal in which the influence of the magnetic interference field is substantially removed.

20. The system of claim 16 further comprising:

a third magnetoresistive element configured to produce a third output signal in response to the external magnetic field, the third magnetoresistive element having a third magnetization direction; and a fourth magnetoresistive element having a fourth magnetization direction that is rotated parallel to the planar surface relative to the third magnetization direction, the fourth magnetoresistive element being configured to produce a fourth output signal in response to the external magnetic field, wherein the processing circuit is further configured to receive the third and fourth output signals, identify from the fourth output signal an influence of the magnetic interference field on the third output signal, and apply a second correction factor to the third output signal to produce a second resultant output signal in which the influence of the magnetic interference field is substantially removed.

* * * * *